United States Patent
Okuda et al.

(10) Patent No.: US 6,696,112 B2
(45) Date of Patent: Feb. 24, 2004

(54) DISPLAY DEVICE HAVING A POLYIMIDE INSULATING LAYER

(75) Inventors: Ryoji Okuda, Shiga (JP); Shigeo Fujimori, Shiga (JP); Tetsuo Oka, Shiga (JP); Masao Tomikawa, Shiga (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 10/069,769

(22) PCT Filed: Jun. 26, 2001

(86) PCT No.: PCT/JP01/05466
§ 371 (c)(1),
(2), (4) Date: Feb. 28, 2002

(87) PCT Pub. No.: WO02/01922
PCT Pub. Date: Jan. 3, 2002

(65) Prior Publication Data
US 2002/0162998 A1 Nov. 7, 2002

(30) Foreign Application Priority Data
Jun. 28, 2000 (JP) ......................................... 2000-194019

(51) Int. Cl.$^7$ ................................................ C09K 19/00
(52) U.S. Cl. ....................................... 428/1.1; 438/149
(58) Field of Search .................. 430/270, 18, 192, 430/193, 326, 330, 165, 191, 919, 920; 428/1.1; 438/149

(56) References Cited

U.S. PATENT DOCUMENTS

| | | | |
|---|---|---|---|
| 5,449,588 A | * | 9/1995 | Maeda et al. ................ 430/270 |
| 5,858,584 A | * | 1/1999 | Okabe et al. ................. 430/18 |
| 6,001,517 A | * | 12/1999 | Kawamonzen ............... 430/18 |
| 6,222,315 B1 | | 4/2001 | Yoshizawa et al. |
| 6,329,110 B1 | * | 12/2001 | Nunomura et al. .......... 430/18 |

FOREIGN PATENT DOCUMENTS

| | | | |
|---|---|---|---|
| EP | 0 888 035 A1 | 12/1998 | |
| JP | 9-114398 A | 5/1997 | |
| JP | 10-186659 A | 7/1998 | |
| JP | 11-097182 A | 4/1999 | |
| JP | 11-106651 A | 4/1999 | |
| JP | 11-106651 | * 4/1999 | ........... C08L/79/08 |
| JP | 2000-030871 A | 1/2000 | |
| WO | WO 97/34447 | 9/1997 | |

OTHER PUBLICATIONS

English translation of Tomikawa Japanese Patent.*

* cited by examiner

Primary Examiner—Mark F. Huff
Assistant Examiner—Jennifer R. Sadula
(74) Attorney, Agent, or Firm—Morrison & Foerster LLP

(57) ABSTRACT

A display device having a polyimide insulating layer is disclosed. The display device has a first electrode formed on a substrate, the polyimide insulating layer formed on the first electrode in such a way that the first electrode is partially exposed, and a second electrode facing the first electrode, wherein the polyimide insulating layer is a positive-type photosensitive polyimide.

6 Claims, 4 Drawing Sheets

15  11 14 16

DISPLAY DEVICE HAVING A POLYIMIDE INSULATING LAYER

TECHNICAL FIELD

This invention relates to a display device having a first electrode formed on a substrate and a second electrode provided facing this.

TECHNICAL BACKGROUND

Light, thin, so-called flat panel displays are the subject of attention as image display devices (displays) to replace bulky, heavy, cathode ray tubes.

Liquid crystal displays (LCDs) are popular as flat panel displays, and electrochromic displays (ECDs) are another example of similar non-luminescent displays, while as examples of the luminescent displays which have recently become a focus of attention there are plasma display panels (PDPs) and electroluminescent displays (ELDs). Amongst the electroluminescent displays, high brightness may be obtained with, in particular, organic electro-luminescent displays and there is considerable research and development in this area due the fact that a full colour display is possible.

These flat panel displays are operated by applying a voltage, or by passing current, between facing first and second electrodes. In such circumstances, since electric charge concentration readily occurs at the edge regions of electrodes with a small radius of curvature, undesirable phenomena such as dielectric breakdown and leakage currents tend to occur at the edge regions.

In order to suppress these phenomena, covering the edge regions of the first electrodes with an insulating layer is known. In this way, it becomes possible to mitigate electric field concentration at the electrode edge regions. Furthermore, in SP-6222315, there is disclosed a technique for further resolving the aforesaid problem by making the thickness of the insulating layer at the boundary portion where the first electrode is exposed by the insulating layer gradually increase with distance from the boundary, or in other words by giving the cross-section a tapering shape, so that there is smooth build-up of the organic thin film layer and second electrode produced by film formation after the forming of the insulating layer.

Generally speaking, polyimides are used as the insulating layer, and non-photosensitive, negative photosensitive and positive photosensitive types are known.

In the case of a non-photosensitive polyimide, in the patterning of the insulating film numerous photolitho processes are required, namely application of the polyimide precursor onto the substrate, prebaking of the polyimide precursor (also referred to as drying or semi-curing), application of a photoresist onto the polyimide precursor, baking of the photoresist (also known as drying or prebaking), exposure of the photoresist, development of the photoresist, etching of the polyimide precursor, elimination of the photoresist, and curing of the polyimide precursor (also referred to as post baking). Consequently, there is the problem that the process is complex and the yield poor.

Furthermore, in order to give the insulating film cross-section a tapering form, it is necessary to optimise various parameters such as the photoresist development conditions and the polyimide precursor etching conditions, and there is the problem that the setting of such conditions is complex.

If a photosensitive type polyimide such as a negative or positive type photosensitive polyimide is used, then patterning of the insulating layer is possible without using a photoresist, and therefore it is possible to overcome the problems of process complexity and poorness of yield. However, with a negative type photosensitive polyimide, instead of a direct tapering shape there tends to be formed an undercut shape or rectangular shape, so no effect is obtained in mitigating electric field concentration at the edge regions. Furthermore, with regard to positive type photosensitive polyimides, while JP-A-8-171989 discloses a technique for introducing an o-nitrobenzyl ester group at the polyamic acid carboxyl group, this positive type photosensitive polyimide has the problem of poor pattern processability, and it is not possible to carry out fine patterning as in the present invention.

The present invention has the objective of carrying out the patterning of an insulating layer comprising polyimide by a simple process. Furthermore, it has the objective of readily obtaining the tapered shape which is the desired cross-section of the insulating layer.

DISCLOSURE OF THE INVENTION

The present invention relates to a display device which is a display device which includes a first electrode formed on a substrate, an insulating layer formed on the first electrode in such a way that the first electrode is partially exposed, and a second electrode provided facing the first electrode, and the insulating layer is a positive-type photosensitive polyimide in which polymer having, as its chief component, structural units represented by the following general formula (1), and a photoacid generator, are the indispensable components.

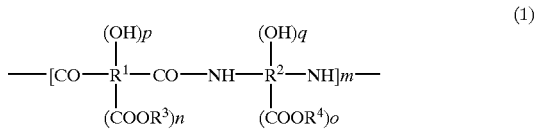

($R^1$ and $R^2$ represent divalent to octavalent organic groups having at least two carbon atoms, and $R^3$ and $R^4$ represent hydrogen, an alkali metal ion, an ammonium ion or an organic group with from 1 to 20 carbons. $R^3$ and $R^4$ may be the same or different. m is an integer in the range 3 to 100,000, and n and o are integers in the range 0 to 2. p and q are integers in the range 0 to 4, and n+q>0.)

| Explanation of the Numerical Codes | |
|---|---|
| 10 | substrate |
| 11 | first electrode |
| 14 | insulating layer |
| 15 | opening |
| 16 | boundary portion |
| 17 | exposed region |
| 18 | photomask |
| 31 | mask region |
| 32 | shadow mask opening |
| 33 | reinforcing wire |
| 34 | frame |

OPTIMUM FORM FOR PRACTISING THE INVENTION

The present invention relates to a display device which contains a first electrode formed on a substrate and a second electrode provided facing the first electrode and, specifically, it applies to, for example, LCDs, ECDs, ELDs and display devices employing organic electro-luminescent elements (organic electroluminescent devices). An organic electroluminescent device is a display device comprising organic electroluminescent elements which contain a first electrode formed on a substrate, a thin film layer containing a light-emitting layer comprising at least an organic compound formed on the first electrode, and a second electrode formed on the thin film layer. In an LCD or ELD, the gap between the first electrode and the second electrode is of the several micron order, but in an organic electroluminescent device the thickness of the thin film layer is about 0.1 to 0.5 $\mu$m, and so the gap between the first electrode and the second electrode is merely of the sub-micron order. Consequently, undesirable phenomena such as the occurrence of current leakage and dielectric breakdown due to electric charge concentration at the electrode edge regions occur more readily when compared to an LCD or ELD and, furthermore, the cross-sectional shape of the insulating layer more readily influences the characteristics of the display device, so the presence of the insulating layer becomes still more important. The insulating layer of the present invention, which comprises a positive-type photosensitive polyimide, functions more effectively in a display device where the gap between the first and second electrodes is comparatively narrow, as in an organic electro-luminescent device.

Figure 1:
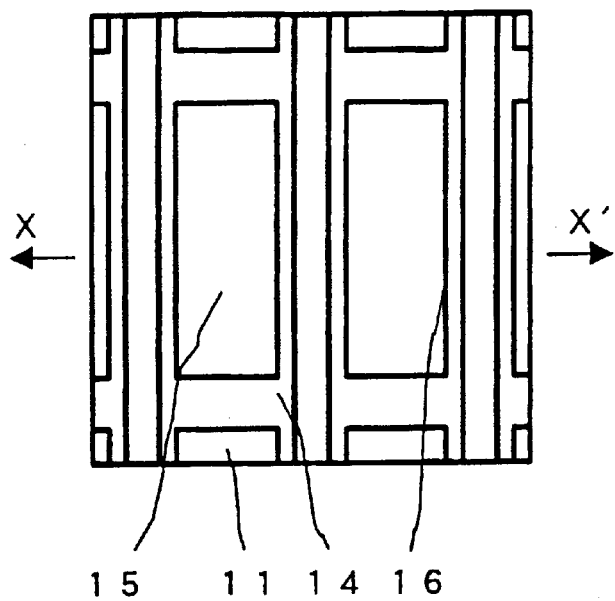
FIG. 1: A plan view showing an example of the form of the insulating layer in the present invention.
Figure 2:
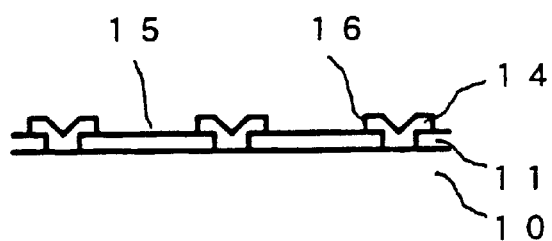
FIG. 2: A sectional view through X–X' in FIG. 1.

The insulating layer of the present invention is formed to cover at least a part of the first electrode so that the first electrode is partially exposed, and the insulating layer is preferably formed so as to cover the edge regions of the first electrode. An example of a particularly preferred form of the insulating layer is shown in FIG. 1 and FIG. 2. There are openings 15 in which the first electrodes 11 formed in the shape of stripes on substrate 10 are exposed, and the regions other than these openings are covered by insulating layer 14. That is to say, insulating layer 14 is formed so that it covers the edge regions of first electrodes 11. Furthermore, it is preferred that where required the insulating layer is formed so as to shield the edge regions of the second electrodes facing the first electrodes. With regard to the opening 15, in an organic electroluminescent device for example it may correspond to one light-emitting region, that is to say a picture element.

Figure 3:
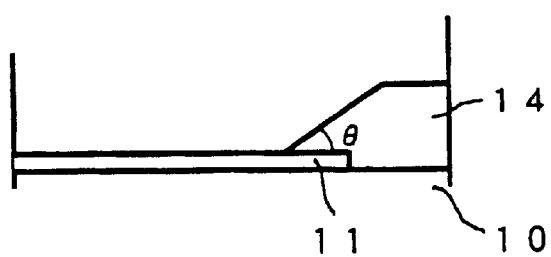
FIG. 3: An enlarged sectional view of the insulating layer boundary portion in FIG. 2.

In the present invention, as shown in FIG. 3, it is preferred that the cross-section of the insulating layer in the boundary portion 16, where the insulating layer 14 exposes the first electrode 11, has a tapered shape. Here, a tapered shape means that the angle θ in the diagram is less than 90°. Now, if an organic electroluminescent device is taken as an example, in the case where the insulating layer cross-section has a tapered shape, when the organic thin film layer and the second electrode are formed after the formation of the insulating layer, these films can be formed smoothly in the boundary portion and it is possible to reduce the film thickness non-uniformities originating in differences in height, so that it is possible to obtain a display device with stable characteristics. The taper angle θ is preferably 80° or less, more preferably 70° or less and still more preferably 45° or less.

The insulating layer is usually formed directly above and in contact with the first electrode. However, in the case where the first electrode is provided with a guide electrode to lower the resistance of the first electrode, it is possible for the insulating layer to be formed so as to contact the guide electrode. In such circumstances, by forming the insulating layer so that it covers the edge regions not only of the first electrode but also of the guide electrode, electric charge concentration can be effectively suppressed.

The thickness of the insulating layer is not particularly restricted but, taking into account ease of film formation and patterning, it is desirable that it be in the range 0.1 to 50 $\mu$m, preferably in the range 0.2 to 50 $\mu$m and more preferably in the range 0.5 to 10 $\mu$m. If the insulating layer is comparatively thin, high precision patterning becomes possible. Furthermore, if the insulating layer is comparatively thick then, at the time of the production of for example an organic electroluminescent device, when carrying out patterning of the light-emitting layer or second electrode layer by the mask vapour-deposition method it can serve as a spacer to prevent the shadow mask damaging the layer already formed on the substrate (i.e. prevent mask flaws).

The insulating layer is formed straddling adjacent first electrodes, so excellent electrical insulation properties are demanded. The volume resistivity of the insulating layer will preferably be at least $5 \times 10^6$ Ωcm and more preferably at least $5 \times 10^7$ Ωcm. Now, in order to enhance the display device contrast, it is possible to blacken the insulating layer but, in such circumstances, care should be taken such that the electrical insulation is not impaired.

In the present invention, a transparent electroconductive material is preferred as the first electrode, and it is possible to use tin oxide, zinc oxide, vanadium oxide, indium oxide, indium tin oxide (ITO) or the like. In display applications where patterning is carried out, it is preferred that there be used ITO-based electrodes of outstanding processability. In order to enhance the electroconductivity, the ITO may contain a small amount of metal such as silver or gold.

The present invention is characterized by the fact that the insulating layer comprises a positive-type photosensitive polyimide. A photosensitive polyimide refers to a material which can undergo direct patterning utilizing the fact that the solubility in developer of regions of the polyimide precursor which have undergone energy irradiation differs from that of un-irradiated regions, after which the polyimide is obtained by curing. An electron beam or the like can be utilized as the irradiation energy but in most cases electromagnetic waves are employed, in particular light from the blue to the ultraviolet (UV) region. Hence, the energy irradiation is referred to as 'exposure'. Furthermore, the elimination of particular regions of the photosensitive polyimide precursor utilizing differences is solubility is referred to as 'developing'. By employing a photosensitive polyimide for the insulating layer, it is possible to markedly shorten the process required for the patterning of the insulating layer, in that there are no longer required the stages of application, exposure and developing of a resist on a non-photosensitive polyimide precursor and elimination of said resist following etching of the non-photosensitive polyimide precursor, as has been required hitherto.

There are two types of photosensitive polyimide, the positive type where the solubility is increased by exposure and the exposed regions are eliminated, and the negative type where hardening occurs by exposure and the un-exposed regions are eliminated. When a photosensitive polyimide precursor undergoes exposure, light is strongly absorbed in the surface region of the film, while the amount of light absorbed tends to fall towards the interior. In other words, in the case of the positive type, the solubility of the surface region of the film becomes greater than that of the interior, while with the negative type it is the opposite. In the present invention, it is preferred that there be used a positive-type photosensitive polyimide in that it facilitates, at a fundamental level, the obtaining of an insulating layer of tapered shape As examples of the polyimide in the present invention, there are polyimides and their polyamic acid precursors, polybenzoxazoles and their polyhydroxyamide precursors, polybenzothiazoles and their polythiohydroxyamide precursors, polybenzimidazoles and their polyaminoamidoimide precursors, and also those forming polymers with oxazole rings and other cyclic structures, but there is no restriction to these. It is preferred that there be used a polymer represented by the following general formula (1).

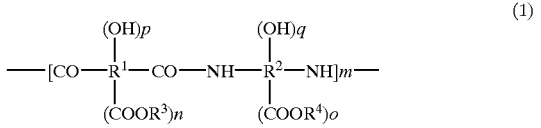

(1)

($R^1$ and $R^2$ represent divalent to octavalent organic groups having at least two carbon atoms, and $R^3$ and $R^4$ represent hydrogen, an alkali metal ion, an ammonium ion or an organic group with 1 to 20 carbons. $R^3$ and $R^4$ may be the same or different. m is an integer in the range 3 to 100,000, and n and o are integers in the range 0 to 2. p and q are integers in the range 0 to 4, and n+q>0.)

As the solvent employed in the present invention, there can be employed for example aprotic solvents such as N-methyl-2-pyrrolidone, γ-butyrolactone, N,N-dimethylformamide, N,N-dimethylacetamide and dimethylsulphoxide, ethers such as tetrahydrofuran, dioxane and propylene glycol monomethyl ether, ketones such as acetone, methyl ethyl ketone and diisobutyl ketone, esters such as ethyl acetate, propylene glycol monomethyl ether acetate and ethyl lactate, aromatic hydrocarbons such as toluene and xylene, or mixtures of such solvents.

In order to enhance the adhesion to the substrate, there can be jointly employed a silane coupling agent, a titanium chelating agent or the like. There is preferably added, in terms of the polymer, from 0.5 to 10 parts by weight of a silane coupling agent such as methyl methacryloxy dimethoxy silane or 3-aminopropyl-trimethoxysilane, or of a titanium chelating agent or aluminium chelating agent.

It is also possible to further enhance the adhesion by treating the substrate. Surface treatment is carried out using a solution of 0.5 to 20 parts by weight of an aforesaid coupling agent in a solvent such as isopropanol, ethanol, methanol, water, tetrahydrofuran, propylene glycol monomethyl ether acetate, propylene glycol monomethyl ether, ethyl lactate or diethyl adipate, by spin coating, immersion, spraying or evaporation, etc. Depending on the circumstances, reaction between the aforesaid coupling agent and the substrate may be promoted by subsequently applying a temperature of from 50° C. to 300° C.

The material of the substrate in the present invention may be of any type which permits metal for the electrodes to be provided at the surface, such as for example a metal, glass, semiconductor, metal oxide insulating film, silicon nitride, polymer film or the like. Glass is preferably employed. There are no particular restrictions on the material of the glass, and there may be used an alkali zinc borosilicate glass, sodium borosilicate glass, soda-lime glass, low-alkali borosilicate glass, barium borosilicate glass, borosilicate glass, aluminosilicate glass, fused quartz glass, synthetic quartz glass or the like. Normally, there is employed alkali-free glass, or soda-lime glass given a barrier coat of $SiO_2$ or the like, so that there is little elution of ions from the glass. Furthermore, the thickness should be sufficient to maintain its mechanical strength, with at least 0.1 mm and preferably at least 0.5 mm being adequate.

Again, where required, for the purposes of enhancing the coating characteristics of the composition of the present invention on the substrate, there may be mixed therein a surfactant, an ester such as ethyl lactate or propylene glycol monomethyl ether acetate, an alcohol such as ethanol, a ketone such as cyclohexanone or methyl isobutyl ketone, or an ether such as tetrahydrofuran or dioxane. Furthermore, there may be added silicon dioxide, titanium dioxide or other inorganic particles, or polyimide powder, etc.

The polymer in which structural units represented by general formula (1) are the chief component can have hydroxyl groups, and the solubility in aqueous alkali solution will be better than that of a polyamic acid without hydroxyl groups. In particular, with regard to the hydroxyl group type, phenolic hydroxyl groups are preferred from the point of view of solubility in aqueous alkali solution.

The polymer represented by general formula (1) in the present invention can form polymer with imide rings, oxazole rings or other such cyclic structures by heating or by means of a suitable catalyst. By forming cyclic structures, the heat resistance and solvent resistance are dramatically improved. In general formula (1), the residue which constitutes $R^1$ represents the structural component of an acid, and it is a divalent to octavalent organic group with at least two carbon atoms. From the point of view of the heat resistance of the polymer in the present invention, it is preferred that $R^1$ contains an aromatic ring or aromatic heterocyclic ring and, furthermore, that it is a divalent to octavalent organic group with 6 to 30 carbon atoms.

In general formula (1), the residue which constitutes $R^2$ represents the structural component of a diamine, and it is a divalent to octavalent organic group with at least two carbon atoms. From the point of view of the heat resistance of the polymer in the present invention, it is preferred that $R^2$ contains an aromatic ring or aromatic heterocyclic ring and, furthermore, that it is a divalent to hexavalent organic group with 6 to 30 carbon atoms.

$R^3$ and $R^4$ in general formula (1) represent hydrogen, an alkali metal ion, an ammonium ion or an organic group with 1 to 20 carbons. In the case where n or o is 2, then the two $R^3$ groups may be the same or different and again the two $R^4$ groups may be the same or different.

The photosensitive resin composition of the present invention may only comprise structural units represented by general formula (1) or it may be a copolymer or blend with other structural units. In such circumstances, it is preferred that it contain at least 90 mol % of structural units represented by general formula (1). The type and amount of other structural units used in a copolymer or blend will preferably be selected from within a range such that the heat resistance of the polymer obtained by the final heat treatment temperature is not impaired.

In the case where $R^3$ and $R^4$ are hydrogen in the polymer chiefly comprising structural units represented by general formula (1), there may be employed the method in which a tetracarboxylic acid dianhydride and a diamine are selectively combined, and these then reacted together in a polar solvent in which the chief component is N-methyl-2-pyrrolidone, N,N-dimethylacetamide, N,N-dimethylformamide, dimethylsulphoxide, hexamethylphosphoramide or the like, or a solvent in which the chief component is γ-butyrolactone.

In the case where $R^3$ and $R^4$ are organic groups with 1 to 20 carbons, in particular alkyl groups, there may be employed the method in which a tetracarboxylic acid dianhydride is reacted with an alcohol compound, after which the acid chloride is synthesized using thionyl chloride, and then this selectively combined with a suitable diamine, or where the selective combination with the diamine is effected using a suitable dehydrating agent such as dicyclohexylcarbodiimide, and reaction carried out in a polar solvent in which the chief component is N-methyl-2-pyrrolidone, N,N-dimethylacetamide, N,N-dimethylformamide, dimethylsulphoxide, hexamethylphosphoramide or the like, or a solvent in which the chief component is γ-butyrolactone.

Furthermore, in the present invention, while there can be used any polymer corresponding to general formula (1), from amongst such polymers those represented by the following formulae are preferred.

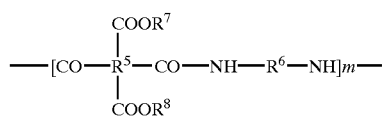
(2)

$R^5$ is a tetravalent organic group with at least two carbon atoms, $R^6$ is a divalent organic group with at least two carbon atoms, and $R^7$ and $R^8$ represent hydrogen, an alkali metal ion, an ammonium ion or an organic group with 1 to 20 carbons. $R^7$ and $R^8$ may be the same or different. m is an integer in the range 3 to 100,000.

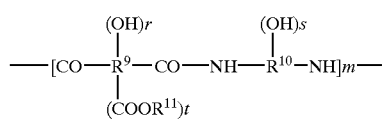
(3)

$R^9$ is a trivalent to octavalent organic group with at least two carbon atoms, $R^{10}$ is a divalent to hexavalent organic group with at least two carbon atoms, and $R^{11}$ represent hydrogen or an organic group with 1 to 20 carbons. m is an integer in the range 3 to 100,000, t is 1 or 2, r and s are integers in the range 0 to 4, and r+s>0.

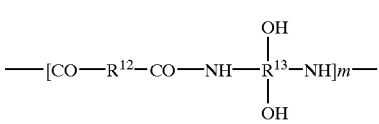
(4)

$R^{12}$ represents a divalent organic group with at least two carbon atoms, and $R^{13}$ represents a tetravalent organic group with at least two carbon atoms. m is an integer in the range 3 to 100,000.

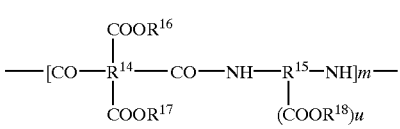
(5)

$R^{14}$ represents a tetravalent organic group with at least two carbon atoms and $R^{15}$ represents a tri- or tetravalent group with at least two carbon atoms. $R^{16}$ to $R^{18}$ represent hydrogen, an alkali metal ion, an ammonium ion or an organic group with 1 to 20 carbons. $R^{16}$ to $R^{18}$ may be the same or different. u is the integer 1 or 2, and in the case where u is 2 then the two $R^{18}$ groups may be the same or different. m is an integer in the range 3 to 100,000.

In aforesaid general formula (2), $R^5$ represents a tetravalent organic group with at least two carbon atoms. In terms of the heat resistance of the polymer in the present invention, it is preferred that $R^5$ contain an aromatic or aromatic heterocyclic ring and, furthermore, that it is a tetravalent organic group with 6 to 30 carbons. Specific examples of $R^5$ are the residues of 3,3',4,4'-biphenyltetracarboxylic acid, 3,3',4,4'-diphenylethertetracarboxylic acid, 3,3',4,4'-diphenylhexafluoropropanetetracarboxylic acid, 3,3',4,4'-benzophenonetetracarboxylic acid, 3,3',4,4'-diphenylsulphonetetracarboxylic acid, pyromellitic acid, butanetetracarboxylic acid, cyclopentanetetracarboxylic acid and the like, but there is no restriction to these. Furthermore, $R^5$ may be composed of one of these, or there may be employed copolymer composed of two or more types of $R^5$.

In general formula (2), $R^6$ is a divalent organic group with at least two carbon atoms. In terms of the heat resistance of the polymer in the present invention, it is preferred that $R^6$ contain an aromatic or aromatic heterocyclic ring and, furthermore, that it is a divalent organic group with 6 to 30 carbons. Preferred specific examples of $R^6$ are the residues of compounds such as p-phenylenediamine, m-phenylenediamine, methyl-p-phenylenediamine, methyl-m-phenylenediamine, dimethyl-p-phenylenediamine, dimethyl-m-phenylenediamine, trimethyl-p-phenylenediamine, trimethyl-m-phenylenediamine, tetramethyl-p-phenylenediamine, tetramethyl-m-phenylenediamine, trifluoromethyl-p-phenylenediamine, trifluoromethyl-m-phenylenediamine, bis(trifluoromethyl)-p-phenylenediamine, bis(trifluoromethyl)-m-phenylenediamine, methoxy-p-phenylenediamine, methoxy-m-phenylenediamine, trifluoromethoxy-p-phenylenediamine, trifluoromethoxy-m-phenylenediamine, fluoro-p-phenylenediamine, fluoro-m-phenylenediamine, chloro-p-phenylenediamine, chloro-m-phenylenediamine, bromo-p-phenylenediamine, bromo-m-phenylenediamine, carboxy-p-phenylenediamine, carboxy-m-phenylenediamine, methoxycarbonyl-p-phenylenediamine, methoxycarbonyl-m-phenylenediamine, diaminodiphenylmethane, bis(aminomethylphenyl)

methane, bis(aminotrifluoromethylphenyl)methane, bis(aminoethylphenyl)methane, bis(aminochlorophenyl)methane, bis(aminodimethylphenyl)methane, bis(aminodiethylphenyl)methane, diaminodiphenylpropane, bis(aminomethylphenyl)propane, bis(aminotrifluoromethylphenyl)propane, bis(aminoethylphenyl)propane, bis(aminochlorophenyl)propane, bis(aminodimethylphenyl)propane, bis(aminodiethylphenyl)propane, diaminodiphenylhexafluoropropane, bis(aminomethylphenyl)hexafluoropropane, bis(aminotrifluoromethylphenyl)hexafluoropropane, bis(aminoethylphenyl)hexafluoropropane, bis(aminochlorophenyl)hexafluoropropane, bis(aminodimethylphenyl)hexafluoropropane, bis(aminodiethylphenyl)hexafluoropropane, diaminodiphenylsulphone, bis(aminomethylphenyl)sulphone, bis(aminoethylphenyl)sulphone, bis(aminotrifluoromethylphenyl)sulphone, bis(aminodimethylphenyl)sulphone, bis(aminodiethylphenyl)sulphone, diaminodiphenyl ether, bis(aminomethylphenyl) ether, bis(aminotrifluoromethylphenyl) ether, bis(aminoethylphenyl) ether, bis(aminodimethylphenyl) ether, bis(aminodiethylphenyl) ether, dimethylbenzidine, bis(trifluoromethyl)benzidine, dichlorobenzidine, bis(aminophenoxy)benzene, bis(aminophenoxyphenyl)propane, bis(aminophenoxyphenyl)hexafluoropropane, bis(aminophenoxyphenyl) ether, bis(aminophenoxyphenyl)methane, bis(aminophenoxyphenyl)sulphone and the like, and also the residues of hydrogenated such compounds, but there is no restriction to these. Furthermore, $R^8$ may be composed of one of these, or there may be employed a copolymer composed of two or more types thereof.

In aforesaid general formula (2), $R^7$ and $R^8$ represent hydrogen, an alkali metal ion, an ammonium ion or an organic group with 1 to 20 carbons. Aliphatic organic groups are preferred as the organic group with 1 to 20 carbons, and as examples of contained organic groups there are hydrocarbon, hydroxyl, carbonyl, carboxyl, urethane, urea and amide groups, but there is no restriction to these. Preferred specific examples are the methyl group, ethyl group, isopropyl group, butyl group, tert-butyl group, ethyl methacrylate group, ethyl acrylate group, propyl methacrylate group, propyl acrylate group, ethyl methacrylamide group, propyl methacrylamide group, ethyl acrylamide group, propyl acrylamide group and the like, but there is no restriction to these. In terms of ease of elimination and rapidity of conversion to the polyimide, it is more preferred that $R^7$ and $R^8$ be hydrogen, an alkali metal ion or an ammonium ion, with hydrogen being most preferred. A single type of $R^7$ and of $R^8$ may be used or there may be employed a mixture of two or more types. Furthermore, $R^7$ and $R^8$ may be the same or they may be different.

Polymer in which structural units represented by general formula (3) are the chief component should preferably have hydroxyl groups. Where the polymer has hydroxyl groups, because of the presence of these hydroxyl groups the solubility in aqueous alkali solution is better than that of a polyamic acid which does not have hydroxyl groups. In particular, from the point of view of solubility in aqueous alkali solution, phenolic hydroxyl groups are preferred.

The residue which constitutes $R^9$ in general formula (3) denotes the structural component of an acid, and it represents a trivalent to octavalent organic group with at least two carbon atoms. This acid component preferably contains an aromatic ring and, furthermore, is a trivalent to octavalent organic group with 2 to 60 carbons which has from 1 to 4 hydroxyl groups. If $R^9$ does not contain hydroxyl groups, it is desirable that the $R^{10}$ component includes from 1 to 4 hydroxyl groups. Furthermore, it is preferred that the hydroxyl groups be positioned next to the amide bonds. As examples, there are the following structures, but the present invention is not to be restricted to these.

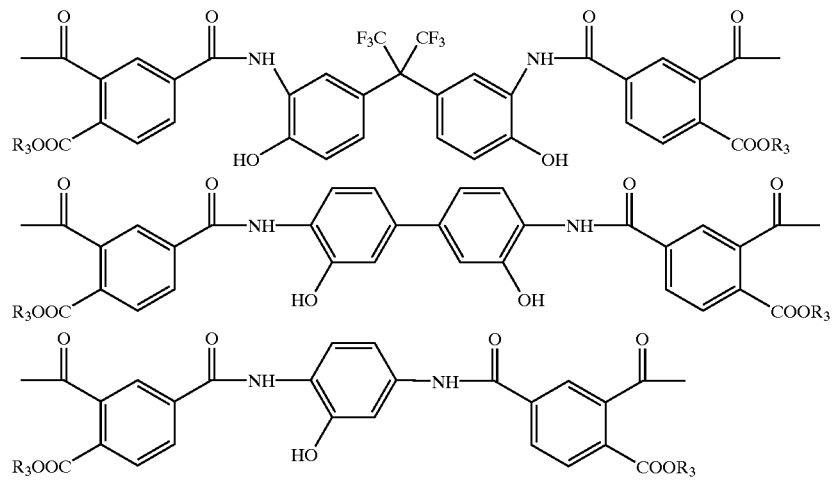

Furthermore, for producing the residue comprising $R^9$, there can be used tetracarboxylic acids, tricarboxylic acids or dicarboxylic acids which do not possess hydroxyl groups. As examples of these, there are aromatic tetracarboxylic acids such as pyromellitic acid, benzophenonetetracarboxylic acid, biphenyl-tetracarboxylic acid, diphenylethertetracarboxylic acid and diphenylsulphonetetracarboxylic acid, the diesters obtained by providing two of the carboxyl groups therein with methyl or ethyl groups, aliphatic tetracarboxylic acids such as butanetetracarboxylic acid and cyclopentanetetracarboxylic acid, and the diester compounds formed by providing two of the carboxyl groups therein with methyl or ethyl groups, and tricarboxylic acids such as trimellitic acid, trimesic acid and naphthalene tricarboxylic acid.

In general formula (3), the residue which constitutes $R^{10}$ denotes the structural component of a diamine. Preferred examples of $R^{10}$, in terms of the heat resistance of the polymer obtained, have aromaticity and, furthermore, have one to four hydroxyl groups. If $R^{10}$ does not have a hydroxyl group, it is preferred that the $R^9$ component contains from 1 to 4 hydroxyl groups. Furthermore, it is preferred that the hydroxyl groups be positioned next to the amide bonds.

Specific examples are compounds such as bis (aminohydroxyphenyl)hexafluoropropane, diaminodihydroxypyrimidine, diaminodihydroxypyridine, hydroxydiaminopyrimidine, 1,3-diamino-4-hydroxybenzene, 1,3-diamino-5-hydroxybenzene, 3,3'-diamino-4,4'-dihydroxybiphenyl, 4,4'-diamino-3,3'-dihydroxybiphenyl, bis(3-amino-4-hydroxyphenyl) sulphone, bis(4-amino-3-hydroxyphenyl)sulphone, bis(3-amino-4-hydroxyphenyl)hexafluoropropane, bis(4-amino-3-hydroxyphenyl)hexafluoropropane, bis(4-amino-3-carboxyphenyl)methane and dihydroxybenzene, and also those with the following structures.

Furthermore, it is also possible to adjust the amount of residual carboxyl groups present by imidation of some of the carboxyl groups. The extent of imidation at this time is preferably from 1% to 50%. If the percentage imidation exceeds 50%, the absorption by the polymer of the actinic radiation used for exposure is increased and the sensitivity decreased.

In general formula (4), $R^{12}$ represents a divalent organic group with at least two carbon atoms. In terms of the heat resistance of the polymer in the present invention, $R^{12}$ preferably contains an aromatic or aromatic heterocyclic ring and is a divalent organic group with 6 to 30 carbons. As preferred specific examples of $R^{12}$, there are the residues of diphenylether-3,3'-dicarboxylic acid, diphenylether-3,4'-dicarboxylic acid, diphenylether-4,4'-dicarboxylic acid, isophthalic acid, benzophenone-3,3'-dicarboxylic acid, benzophenone-3,4'-dicarboxylic acid, benzophenone-4,4'-dicarboxylic acid, diphenylsulphone-3,3'-dicarboxylic acid,

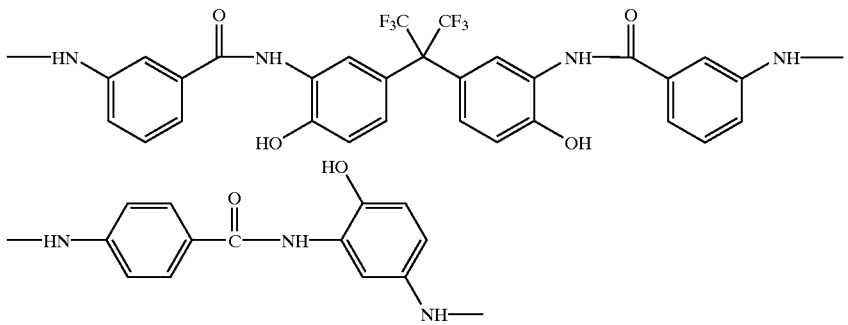

Furthermore, for producing the residue comprising $R^{10}$ in general formula (3), it is possible to employ diamines which do not contain hydroxyl groups. As examples thereof, there are phenylenediamine, diaminodiphenyl ether, aminophenoxybenzene, diaminodiphenylmethane, diaminodiphenylsulphone, bis(trifluoromethyl)benzidine, bis(aminophenoxyphenyl)propane, bis(aminophenoxyphenyl)-sulphone and the compounds obtained by providing the aromatic rings therein with alkyl group or halogen atom substituents, and also aliphatic cyclohexyldiamine, methylene-biscyclohexylamine and the like. These diamine compounds may be used on their own or they can be used in combinations of two or more types. It is preferred that there be used no more than 40 mol % of such diamine component. If more than 40 mol % is copolymerized, then the heat resistance of the polymer obtained is lowered.

$R^{11}$ in general formula (3) represents hydrogen or an organic group with 1 to 20 carbons. More preferably, it is an organic group with 1 to 10 carbons. If the number of carbons in $R^{11}$ exceeds 20 then solubility in aqueous alkali solution is lost. In terms of the stability of the photosensitive resin solution obtained, it is preferred that $R^{11}$ be an organic group, but from the point of view of the solubility in aqueous alkali solution it is preferred that it be hydrogen. In other words, it is preferred that $R^{11}$ be neither all hydrogen nor all organic groups. By controlling the proportion of hydrogen and organic groups which constitutes $R^{11}$, the solubility rate in aqueous alkali solution may be varied so it is possible, by such adjustment, to obtain a photosensitive resin composition with a suitable dissolution rate. m is an integer in the range 3 to 100,000, t is 1 or 2, r and s are integers in the range 0 to 4 and, furthermore, r+s>0. If r is 5 or more, the properties of the heat-resistant resin film obtained are lowered.

diphenylsulphone-3,4'-dicarboxylic acid, diphenylsulphone-4,4'-dicarboxylic acid and the like, but there is no restriction to these. Again, $R^{14}$ may comprise one of these or there may be employed copolymer in which there are two or more types thereof.

In general formula (4), $R^{13}$ represents a tetravalent organic group with at least two carbon atoms. In terms of the heat resistance of the polymer in the present invention, $R^{13}$ preferably contains an aromatic or aromatic heterocyclic ring and is a tetravalent organic group with 6 to 30 carbons. Preferred specific examples of $R^{13}$ are the residues of 3,3'-diamino-4,4'-dihydroxydiphenyl ether, 4,4'-diamino-3,3'-dihydroxydiphenyl ether, 3,4'-diamino-3,4'-dihydroxydiphenyl ether and the like, but there is no restriction to these.

Again, $R^{13}$ may comprise one of these or there may be employed copolymer in which there are two or more types thereof.

The polybenzoxazole precursor represented by general formula (4) can be obtained by a method such as the condensation of a dihydroxydiamine and a halogenated dicarboxylic acid, or the condensation of a dihydroxydiamine and a dicarboxylic acid in the presence of a dehydrocondensing agent such as dicyclohexyl-carbodiimide.

In general formula (5), $R^{14}$ represents a tetravalent organic group with at least two carbon atoms, and $R^{15}$ represents a tri- or tetravalent organic group with at least two carbon atoms. In terms of the heat resistance of the polymer in the present invention, $R^{15}$ preferably contains an aromatic or an aromatic heterocyclic ring and is a divalent organic group with 6 to 30 carbons. It is desirable that four bonding positions are present on the aromatic ring. As specific examples of $R^{15}$ there are oxydiphthalic acid, pyromellitic acid, benzophenone-tetracarboxylic acid, biphenyltetracarboxylic acid, naphthalenetetracarboxylic acid, pyridinetetracarboxylic acid, perylene-tetracarboxylic acid, sulphonyldiphthalic acid, m-terphenyl-3,3',4,4'-tetracarboxylic acid, p-terphenyl-3,3',4,4'-tetracarboxylic acid, diphenylethertetracarboxylic acid, diphenylsulphone tetracarboxylic acid and other such aromatic tetracarboxylic acids, and the compounds obtained by esterification of two carboxyl groups therein with methyl or ethyl groups, butanetetracarboxylic acid, cyclopentanetetracarboxylic acid and other such aliphatic tetracarboxylic acids and the compounds obtained by esterification of two carboxyl groups therein with methyl or ethyl groups, and trimellitic acid, trimesic acid, napthalenetricarboxylic acid and other such aromatic tricarboxylic acids.

In aforesaid general formula (5), $R^{16}$ and $R^{17}$ represent hydrogen, an alkali metal ion, an ammonium ion or an organic group with 1 to 20 carbons. An aliphatic organic group is preferred as the organic group with 1 to 20 carbons, and as examples of contained organic groups there are an hydrocarbon, hydroxyl, carbonyl, carboxyl, urethane, urea and amide groups. Specific examples are the methyl group, ethyl group, isopropyl group, butyl group, tert-butyl group, ethyl methacrylate group, ethyl acrylate group, propyl methacrylate group, propyl acrylate group, ethyl methacrylamide group, propyl methacrylamide group, ethyl acrylamide group, propyl acrylamide group and the like. Preferred examples are the methyl group, ethyl group, isopropyl group, butyl group and tert-butyl group.

In general formula (5), $R^{15}$ represents a trivalent organic group containing at least two carbon atoms. In terms of the heat resistance of the polymer in the present invention, $R^{15}$ preferably contains an aromatic or aromatic heterocyclic ring and is a tri- or tetravalent organic group with 6 to 30 carbons. Specific examples of $R^{15}$ are those derived from 2,5-diaminobenzoic acid, 3,4-diaminobenzoic acid, 3,5-diaminobenzoic acid, 2,5-diaminoterephthalic acid, bis(4-amino-3-carboxyphenyl)methylene, 4,4'-diamino-3,3'-dicarboxybiphenyl, 4,4'-diamino-5,5'-dicarboxy-2,2'-dimethylbiphenyl and the like. These may be used on their own or two or more types may be jointly employed.

Again, optionally, other diamine compounds can also be used, examples of which are m-phenylenediamine, 3,4-diaminodiphenylether, 3,3'-diaminodiphenylsulphone, 3,3'-diaminodiphenylsulphide, p-phenylenediamine, 4,4'-diaminodiphenyl ether, 4,4'-diaminodiphenylmethane, 4,4'-diaminodiphenylsulphone, 4,4'-diaminodiphenylsulphide, 3,3',5,5'-tetramethyl-4,4'-diaminodiphenylmethane, 2,2'-bis(4-aminophenyl)propane, 4,4'-methylenedianiline, 4,4'-diaminodiphenylether-3-carbodiamide and other such aromatic diamines, 1,3-bis(3-aminopropyl)-1,1,3,3-tetramethyldisiloxane and other such siloxane type diamines. One or a combination of two or more of these may be used. Now, the amount of such other diamine compound used is preferably no more than 90 mol % in terms of the total number of moles of diamine compound.

It is preferred that the polymer represented by general formula (1), general formula (2), general formula (3), general formula (4) or general formula (5) be, as far as possible, transparent to the actinic radiation used for exposure. Hence, the absorbance of the polymer at 365 nm, per 1 μm, is preferably no more than 0.1. More preferably it is no more than 0.08. If it exceeds 0.1, the sensitivity in terms of exposure to 365 nm actinic radiation is reduced.

Photosensitivity can be conferred on the polymer in which structural units represented by general formula (1) are the chief component by the addition of a photoacid generator. In particular, this is preferably used in polymer in which structural units represented by general formula (3), general formula (4) or general formula (5) are the chief component.

As examples of the photoacid generator employed in the present invention, there are diazonium salts, diazoquinone sulphonamides, diazoquinone sulphonic acid esters, diazoquinone sulphonates, nitrobenzyl esters, onium salts, halides, halogenated isocyanates, halogenated triazines, bisarylsulphonyldiazomethanes, disulphones and other such compounds which are decomposed by light irradiation and generate acid. In particular, o-quinonediazide compounds are preferred, since they have the effect of suppressing the aqueous solubility of unexposed regions. Examples of such compounds are 1,2-benzoquinone-2-azido-4-sulphonic acid ester or sulphonic acid amide, 1,2-naphthoquinone-2-diazido-5-sulphonic acid ester or sulphonic acid amide, and 1,2-naphthoquinone-2-diazido-4-sulphonic acid ester or sulphonic acid amide. These can be obtained for example by a condensation reaction between an o-quinonediazidesulphonyl chloride such as 1,2-benzoquinone-2-azido-4-sulphonyl chloride, 1,2-naphthoquinone-2-diazido-5-sulphonyl chloride or 1,2-naphthoquinone-2-diazido-4-sulphonyl chloride and a polyhydroxy compound or polyamino compound in the presence of a dehydrochlorination catalyst.

Examples of the polyhydroxy compounds are hydroquinone, resorcinol, pyrogallol, bisphenol A, bis(4-hydroxyphenyl)methane, 2,2-bis(4-hydroxyphenyl) hexafluoropropane, 2,3,4-trihydroxybenzophenone, 2,3,4,4'-tetrahydroxybenzophenone, 2,2',4,4'-tetrahydroxybenzophenone, tris(4-hydroxyphenyl)methane, 1,1,1-tris(4-hydroxyphenyl)ethane, 1-[1-(4-hydroxyphenyl)isopropyl]-4-[1,1-bis(4-hydroxyphenyl)ethyl]benzene, 4-phenylmethyl-1,2,3-benzenetriol, 4-ethyl-1,3-benzenediol, 4-phenylmethyl-1,3-benzenediol, 4-(1-methyl-1-phenylethyl)-1,3-benzenediol, (2,4-dihydroxyphenyl)phenylmethanone, 4-diphenylmethyl-1,2,3-benzenetriol, 2,4',4''-trihydroxytriphenylmethane, 2,6-bis[(2-hydroxy-5-methylphenyl)methyl]-4-methylphenol, 4,4'-[1-[4-[1-(4-hydroxyphenyl)-1-methylethyl]phenyl]ethylidene]biphenol, 1,1,1-tris(4-hydroxyphenyl)ethane, 4,6-bis[(4-hydroxyphenyl)methyl]-1,3-benzenediol, 4,4',4'',4'''-(1,2-ethanediylidene)tetrakisphenol, 2,6-bis[(4-hydroxyphenyl)methyl]-4-methylphenol, 4,4'-[4-(4-hydroxyphenyl)cyclohexylidene]bisphenol, 2,4-bis[(4-hydroxyphenyl)methyl]-6-cyclohexylphenol, 2,2'-methylenebis[6-[(2/4-hydroxyphenyl)methyl]-4-methylphenol], 2,2'-biphenol, 4,4'-cyclohexylidenebisphenol 4,4'-cyclopentylidenebisphenol 2,2'-dihydroxydiphenyl ether, 4,4'-dihydroxydiphenyl ether, 4,4'-[1,4-phenylenebis(1-methylethylidene)]bis-[benzene-1,2-diol], 5,5'-[1,4-phenylenebis(1-methylethylidene)]bis[benzene-1,2,3-triol] 4-[1-(4-hydroxyphenyl)-1-methylethyl]-1,3-benzenediol, 4-[1-(4-hydroxyphenyl)cyclohexyl]-1,2-benzenediol, 4-[1-(4-hydroxyphenyl)cyclohexyl]-1,3-benzenediol, 4-[1(4-hydroxyphenyl)cyclohexylidene]-1,2,3-benzenetriol methyl gallate, ethyl gallate and the like.

As examples of polyamino compounds, there are 1,4-phenylenediamine, 1,3-phenylenediamine, 4,4'-diaminodiphenyl ether, 4,4'-diaminodiphenylmethane, 4,4'-diaminodiphenylsulphone, 4,4'-diaminodiphenylsulphide and the like.

Again, as examples of polyhydroxypolyamino compounds, there are 2,2-bis(3-amino-4-hydroxyphenyl) hexafluoropropane, 3,3'-dihydroxybenzidine and the like.

Specific examples of the photoacid generator employed in the present invention are o-quinonediazide compounds based on methyl 3,4,5-trihydroxybenzoate, 4,4'-[1-[4-[1-(4-hydroxyphenyl)-1-methylethyl]phenyl]ethylidene] bisphenol, 4,4',4"-ethylidenetrisphenol, 4,6-bis[(4-hydroxyphenyl)methyl]-1,3-benzenediol, 4,4,4',4'-tetrakis [(1-methylethylidene)bis(1,4-cyclohexylidene)]phenol and 4,4'-[4-(4-hydroxyphenyl)cyclohexylidene]bisphenol, where at least one hydroxyl group is replaced by the 1,2-naphthoquinonediazido-4-sulphonyl group or 1,2-naphthoquinonediazido-5-sulphonyl group.

Preferably from 5 to 100 parts by weight, and more preferably from 5 to 40 parts by weight of the o-quinonediazide compound is mixed per 100 parts by weight of the polymer represented by general formula (1). With less than 5 parts by weight, sufficient sensitivity is not obtained, while with more than 100 parts by weight pattern formation by light irradiation and subsequent developing is difficult and there is the possibility of a lowering of the heat resistance of the resin composition.

Again, it is also possible to use a solubility regulating agent for the purposes of adjusting the ratio of the dissolution rates of the unexposed and exposed regions. Examples of solubility regulators are polyhydroxy compounds, sulphonamide compounds, urea compounds and the like and, generally speaking, where they are used as solubility regulators in positive resists, any such compound may be favourably employed. In particular, there is preferably used the polyhydroxy compound which is the starting material at the time of the quinonediazide compound synthesis. Specific examples are methyl 3,4,5-trihydroxybenzoate, 4,4'-[1-[4-[1-(4-hydroxyphenyl)-1-methylethyl]phenyl]ethylidene] bisphenol, 4,4',4"-ethylidenetrisphenol, 4,6-bis[(4-hydroxyphenyl)methyl]-1,3-benzenediol and 4,4,4',4'-tetrakis[(1-methylethylidene)bis(1,4-cyclohexylidene)] phenol, but there is no restriction to these.

There is preferably mixed from 1 to 100 parts by weight, and more preferably 5 to 40 parts by weight, of the solubility regulator per 100 parts by weight of the polymer represented by general formula (1). With less than 1 part by weight, sufficient effect is not obtained, whereas if the amount exceeds 100 parts by weight there is a possibility of the heat resistance of the resin composition falling. Consequently, it is preferred that the amount of solubility regulator be kept to the minimum required.

Figure 4:
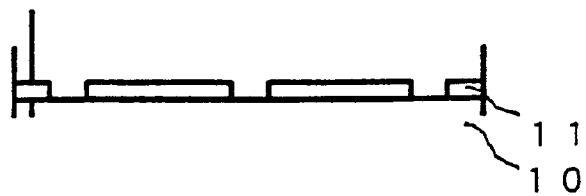
FIG. 4: A sectional view showing the substrate with patterned first electrodes.
Figure 5:
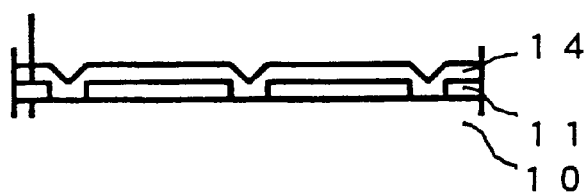
FIG. 5: A sectional view showing the positive type photosensitive polyimide applied onto the substrate.

The patterning of an insulating layer employing a positive type photosensitive polyimide can be carried out by the following process. Over the entire face of substrate 10 on which patterning of the first electrodes 11 has been carried out (FIG. 4), there is coated the positive-type photosensitive polyimide precursor film (FIG. 5). The coating method used can be a known technique such as the spin coating method, the slit die coating method, the spray method, the roll coating method, the dipping method or the like. Furthermore, coating is carried out such that the coated film thickness after drying is 0.1 to 150 µm. Preferably it is 0.5 to 20 µm.

Figure 6:
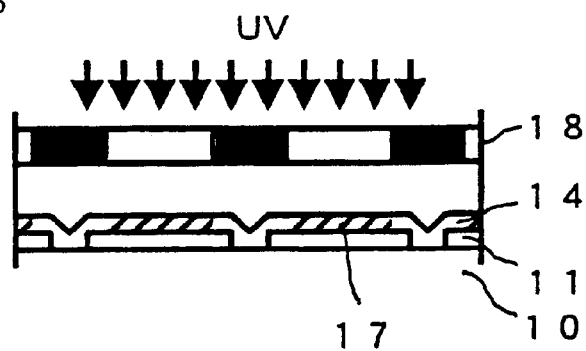
FIG. 6: A sectional view showing the exposure of the polyimide precursor film.
Figure 7:
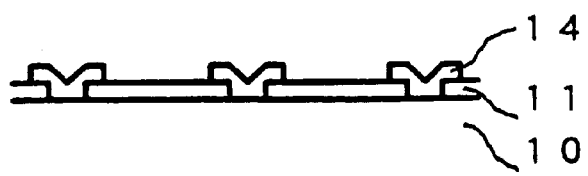
FIG. 7: A sectional view showing the developed polyimide precursor film following exposure.

After optional prebaking of the coated polyimide precursor, exposure is carried out through a photomask 18 (FIG. 6). In the exposed regions 17, the solubility is increased, so that the desired polyimide pattern can be obtained by dissolving away the exposed regions by immersion of the substrate in the developer, followed by curing where required (FIG. 7).

The positive type photosensitive polyimide in the present invention preferably has an oxazole structure in order to realize good storage stability in the precursor state and in order to achieve good photosensitivity and developing properties. The oxazole structure has a characteristic infrared absorption peak in the region of 1477 $cm^{-1}$. In the polyimide, the characteristic infrared absorption peaks of the imide structure are at 1775–80 $cm^{-1}$, in the region of 1725 $cm^{-1}$ and in the region of 1380 $cm^{-1}$. Hence, it is possible to clearly distinguish between them.

The prebaking of the positive type photosensitive polyimide precursor in the present invention is preferably carried out for from 1 minute to several hours in the range from 50° C. to 150° C. using an oven, hot plate, infrared radiation or the like. Where required, drying is also possible in two or more stages, such as 2 minutes at 80° C. followed by 2 minutes at 120° C.

As examples of the actinic radiation used for exposure, there are ultraviolet rays, visible rays, an electron beam, X-rays and the like, but the use of a mercury lamp i-line (365 nm), h-line (405 nm) or g-line (436 nm) is preferred. One type of light of such wavelength may be used or there may be favourably employed a mixture of two or more types.

There may also be introduced a baking treatment stage prior to the developing, for the purposes of raising the pattern resolution at the time of developing and broadening the permissible range of development conditions. The temperature thereof is preferably in the range 50–180° C. and, in particular, more preferably 60–150° C. The time is preferably in the range from 10 seconds to a few hours. Outside of these ranges, either reaction will not proceed or there is fear that all regions will become insoluble, so care is necessary.

As the developer, there is preferably employed the aqueous solution of a compound which displays alkalinity such as an aqueous solution of tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, hexamethylenediamine or the like. An aqueous solution of tetramethylammonium hydroxide (TMAH) is especially ideal as the developer. Furthermore, in certain circumstances, there may be used a combination of such aqueous alkali solution and one or more polar solvent such as N-methyl-2-pyrrolidone, N,N-dimethylformamide, N,N-dimethylacetamide, dimethylsulphoxide, γ-butyrolactone or dimethylacrylamide, alcohol such as methanol, ethanol or isopropanol, ester such as ethyl lactate or propylene glycol monomethyl ether acetate, or ketone such as cyclopentanone, cyclohexanone, isobutyl ketone or methyl isobutyl ketone.

After developing, a rinsing treatment is carried out with water. This rinsing treatment may also be carried out with an alcohol such as ethanol or isopropyl alcohol or ester such as ethyl lactate or propylene glycol monomethyl ether acetate added to the water. In the developing or rinsing, an ultrasonic treatment can be carried out.

The curing is preferably carried out at a temperature in the range from 200° C. to 500° C., and more preferably in the range 250° C. to 350° C. The heat treatment is carried out for from 5 minutes to 5 hours, by temperature selection and raising of the temperature in a stepwise fashion, or selecting a temperature range and continuously raising the temperature. As an example, heat treatment may be carried out for 30 minute periods at 140° C., 200° C. and 350° C., or alternatively there is the method of linearly raising the temperature over two hours from room temperature to 400° C. It is preferred that the glass transition temperature of the photosensitive polyimide of the present invention be between 260° C. and 350° C., and more preferably between 280° C. and 350° C. Furthermore, it is preferred that the 5% weight loss heating temperature be at least 350° C. The refractive index is not particularly restricted but is preferably no more than 1.8.

The dielectric breakdown strength refers to the slope of the minimum potential where the insulating material breaks down, and it denotes the value of the dielectric breakdown voltage divided by the distance between the two electrodes (thickness of the test-piece). The dielectric breakdown strength of the photosensitive polyimide of the present invention is preferably at least 200 kV/mm and more preferably at least 300 kV/mm, so as to make shorting due to electric charge concentration difficult to occur at the time of organic EL operation. Furthermore, it is preferred that when the polyimide of the present invention is maintained at 85° C. for at least 200 hours, the reduction in the dielectric breakdown strength is no more than 10% and more preferably no more than 5%.

The measurement of the dielectric breakdown strength is normally carried out by producing a measurement test-piece but it can also be advantageously measured by dismantling the device after construction of the display device in the present invention. Measurement is carried out based on JIS-C-2110.

That is to say, in the case where a measurement test-piece is used, the varnish is coated onto a metal substrate and then prebaked, after which it is cured in a clean oven to produce the test piece. For the coating, prebaking and curing, there are preferably used conditions identical to those for the insulating layer in the actual display device. As the material of the metal substrate, there may be used any material through which electricity will pass such as an aluminium alloy, iron, brass, stainless steel or the like, but the use of an aluminium alloy or brass is particularly preferred. Taking the metal substrate of the test piece as the lower electrode, the test piece is sandwiched between this and a brass electrode, and then voltage applied while raising the voltage at a fixed rate until dielectric breakdown occurs, at which point the voltage is measured. This insulation breakdown voltage is divided by the thickness of the test-piece, and the dielectric breakdown strength calculated. The thickness of the test-piece is measured using an ellipsometer or a surface roughness meter.

Furthermore, in the case where the dielectric breakdown strength is measured after construction of the display device, the display device is dismantled and the light-emitting display portion extracted. Thereafter, in the region where the insulating layer is coated onto the ITO, the second electrode and the light-emitting layer or other organic layers are dissolved/separated away using organic solvent, and the insulating layer exposed. The organic solvent should be one which can dissolve or separate away the organic layers such as the light-emitting layer, but which does not dissolve the insulating layer. Specifically, examples include ketone solvents such as acetone, halogen solvents such as chloroform and dichloroethane, and ester solvents such as ethyl acetate, but there is no restriction to these. Thereafter, where necessary, the insulating layer is given a cleaning treatment with UV-O3. With the ITO electrode beneath the exposed insulating layer serving as the lower electrode, the insulating layer is sandwiched between this and a needle electrode as the upper electrode, and then voltage applied while raising the voltage at a fixed rate until dielectric breakdown occurs, at which point the voltage is measured. This dielectric breakdown voltage is divided by the thickness of the test-piece, and the dielectric breakdown strength calculated. As the needle electrode, there is preferably employed any material which is thin like a needle and through which electricity passes. Preferably there is used a tungsten, stainless steel or other material of thickness 10 μm to 1 mm, where the radius of curvature of the tip region which contacts the insulating layer is 5 μm to 500 μm. The thickness of the test-piece is measured using an ellipsometer or a surface roughness meter.

EXAMPLES

Below, the present invention is explained by providing examples but the invention is not to be restricted by these examples.

Measurement of the Dielectric Breakdown Strength
1. Case Where a Measurement Test-piece is Used The varnish was applied onto a 5 cm×5 cm×0.5 mm aluminium alloy (type 1100) substrate and, after prebaking for 2 minutes at 120° C., curing was carried out by heating under a nitrogen atmosphere in a clean oven at 170° C. for 30 minutes and then for a further 60 minutes at 320° C., to produce the test-piece.

The measurement was based on JIS-C-2110. Specifically, with the aluminium alloy substrate as the lower electrode, the test piece was sandwiched between this and a brass electrode, and voltage applied. The voltage was raised at a constant rate and the value measured when dielectric breakdown occurred. This breakdown voltage was divided by the thickness of the test-piece, and the dielectric breakdown strength calculated. The thickness of the test-piece was measured using a LambdaÅ STM-602J (made by Dainippon Screen Mfg Co.).

2. Case Where Measurement is Carried Out Following Production of the Display Device The display device was dismantled and the light-emitting display portion removed. Subsequently, in the region where the insulating layer was applied on the ITO, the second electrode and organic layers such as the light-emitting layer were removed by dissolving or separating-away using acetone, and the insulating layer exposed. The insulating layer was then subjected to a UV-O3 cleaning treatment for 10 minutes. Next, with the insulating layer interposed between the ITO electrode beneath the exposed insulating layer, as the lower electrode, and a needle electrode W20-158-5 (produced by the Data Probe Co., tungsten, radius of curvature 12.7 μm), as the upper electrode, voltage was applied. The voltage was raised at a constant rate and the value measured when breakdown occurred. This dielectric breakdown voltage was divided by the thickness of the test-piece, and the dielectric breakdown strength calculated. The thickness of the insulating layer was measured using a Surfcom 1500A surface hardness meter (made by the Tokyo Seimitsu Co.).

Synthesis Example 1

Synthesis of the Hydroxyl-group-containing Acid Anhydride

Under a current of dry nitrogen, 18.3 g (0.05 mol) of 2,2-bis(3-amino-4-hydroxyphenyl)hexafluoropropane (BAHF) and 34.2 g (0.3 mol) of glycidyl methyl ether were dissolved in 100 g of ethyl acetate, and cooled to −15° C. To this, there was added dropwise 22.1 g (0.11 mol) of trimellitic anhydride chloride dissolved in 50 g of ethyl acetate, such that the temperature of the reaction liquid did not exceed 0° C. Following the end of the dropwise addition, reaction was carried out for 4 hours at 0° C.

This solution was concentrated with a rotary evaporator, and then poured into 1 liter of toluene and the acid anhydride obtained. This is shown below.

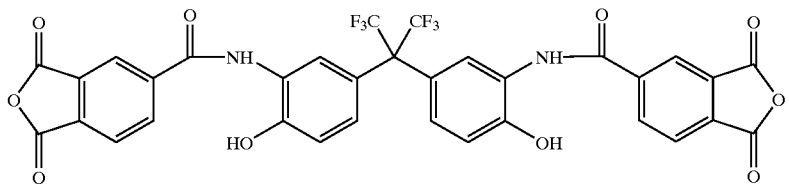

Synthesis Example 2

Synthesis of the Hydroxyl-group-containing Diamine Compound 18.3 g (0.05 mol) of BAHF was dissolved in 100 ml of acetone and 17.4 g (0.3 mol) of propylene oxide, and cooled to −15° C. Next there was added dropwise a solution of 20.4 g (0.11 mol) of 3-nitrobenzoyl chloride dissolved in 100 ml of acetone. Following the end of the dropwise addition, reaction was carried out for 4 hours at −15° C. and thereafter the temperature was returned to room temperature. The solution was concentrated using a rotary evaporator, and the solid obtained was recrystallized using a mixture of tetrahydrofuran and ethanol.

30 g of the solid collected by the recrystallization was introduced into a 300 ml stainless steel autoclave, dispersed in 250 ml of Methyl Cellosolve and then 2 g of 5% palladium-carbon added. Hydrogen was introduced using a balloon, and a reduction reaction carried out at room temperature. After about 4 hours,. when it was confirmed that there was no further deflation of the balloon, the reaction was halted. Following the end of the reaction, filtering was carried out and the palladium compound which served as the catalyst was removed. Concentration was carried out using a rotary evaporator and the diamine compound obtained. This is shown below. The solid obtained was employed directly for reaction.

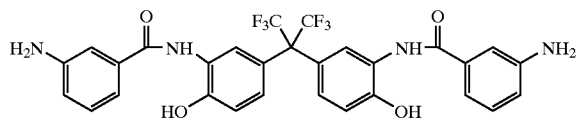

Synthesis Example 3

Synthesis of Quinonediazide Compound (1)

Under a current of nitrogen, 16.1 g (0.05 mol) of BisRS-2P (commercial name, produced by the Honshu Chemical Industry Co.) and 26.9 g (0.1 mol) of 5-naphthoquinonediazide sulphonyl chloride were dissolved in 450 g of 1,4-dioxane, and brought to room temperature. There was then added dropwise 10.1 g of triethylamine mixed with 50 g of 1,4-dioxane, such that the interior of the system did not exceed 35° C. Following the end of the dropwise addition, stirring was carried out for 2 hours at 30° C. The triethylamine salt was filtered off and the filtrate introduced into water. Thereafter, the precipitate which was deposited was collected by filtering. The precipitate was dried in a vacuum dryer and quinonediazide (1) obtained.

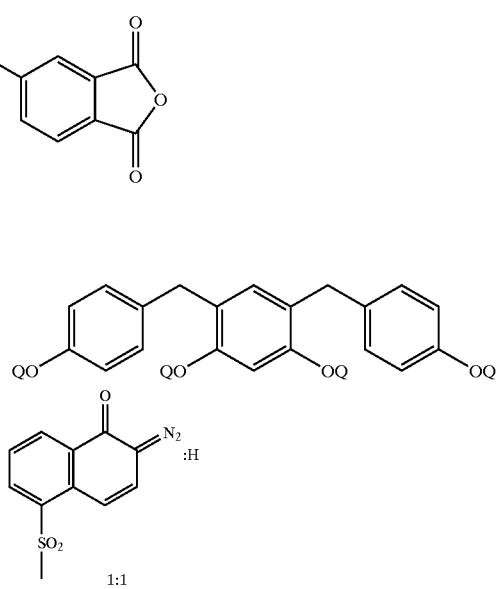

Synthesis Example 4

Synthesis of Quinonediazide Compound (2)

Under a current of nitrogen, 15.3 g (0.05 mol) of TrisP-HAP (commercial name, produced by the Honshu Chemical Industry Co.) and 40.3 g (0.15 mol) of 5-naphthoquinonediazide sulphonyl chloride were dissolved in 450 g of 1,4-dioxane and brought to room temperature. Thereafter, quinonediazide compound (2) was obtained in the same way as in Synthesis Example 3 using 15.2 g of triethylamine mixed with 50 g of 1,4-dioxane.

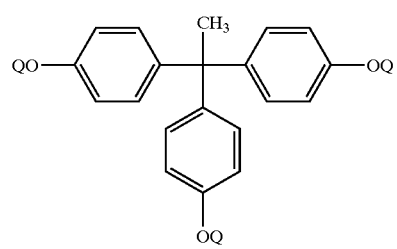

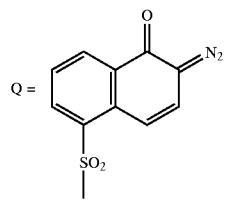

Synthesis Example 5

Synthesis of Quinonediazide Compound (3)

Under a current of dry nitrogen, 19.7 g (0.05 mol) of BIR-PTBP (commercial name, produced by the Honshu Chemical Industry Co.) and 26.9 g (0.1 mol) of 4-naphthoquinonediazide sulphonyl chloride were dissolved in 450 g of 1,4-dioxane and brought to room temperature. Thereafter, quinonediazide compound (3) was obtained in the same way as in Synthesis Example 3 using 10.1 g of triethylamine mixed with 50 g of 1,4-dioxane.

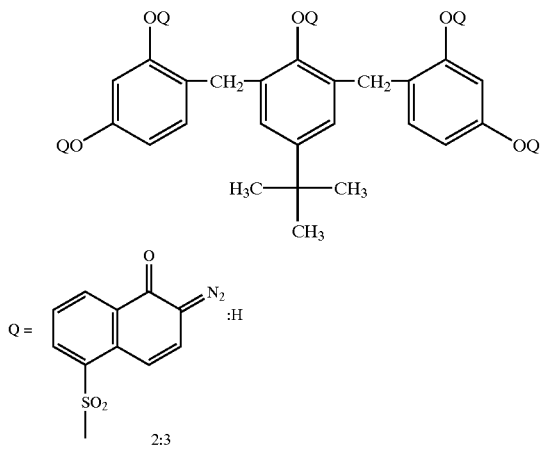

Synthesis Example 6

Under a current of dry nitrogen, 5.0 g (0.02 mol) of 4,4'-diaminophenyl ether and 1.2 g (0.005 mol) of 1,3-bis(3-aminopropyl)tetramethyldisiloxane were dissolved in 50 g of N-methyl-2-pyrrolidone (NMP). To this, 21.4 g (0.03 mol) of the hydroxyl-group-containing acid anhydride obtained in Synthesis Example 1 and 14 g of NMP were added, then reaction carried out for 1 hour at 20° C., followed by 4 hours reaction at 50° C. Thereafter, a solution of 7.1 g (0.06 mol) of N,N-dimethylformamide dimethyl acetal diluted with 5 g of NMP was added dropwise over 10 minutes. Following the end of the dropwise addition, stirring was carried out for 3 hours at 50° C.

2 g of quinonediazide compound (1) obtained in Synthesis Example 3 was dissolved in 40 g of the polymer solution obtained, and photosensitive resin varnish A obtained. When the dielectric breakdown strength of cured film of the varnish obtained was measured using a measurement test-piece, it was 400 kV/mm.

Synthesis Example 7

Under a current of dry nitrogen, 15.1 g (0.025 mol) of the hydroxyl-group-containing diamine obtained in Synthesis Example 2 was dissolved in 50 g of NMP. To this, 17.5 g (0.025 mol) of the hydroxyl-group-containing acid anhydride obtained in Synthesis Example 1 and 30 g of pyridine were added, and then reaction carried out for 6 hours at 60° C. Following the end of the reaction, the solution was introduced into 2 liters of water and the precipitate of polymer solid collected by filtering. The polymer solid was dried for 20 hours in a vacuum dryer at 80° C. 10 g of the polymer solid obtained in this way was measured out, and dissolved in 30 g of GBL along with 2 g of the quinonediazide compound (2) obtained in Synthesis Example 4, 1.5 g of Bis-Z (commercial name, produced by the Honshu Chemical Industry Co.) and 1 g of vinylmethoxysilane to obtain photosensitive resin varnish B. When the dielectric breakdown strength of cured film of the varnish was measured using a measurement test-piece, it was 410 kV/mm.

Synthesis Example 8

Under a current of dry nitrogen, 27.2 g (0.045 mol) of the hydroxyl-group-containing diamine obtained in Synthesis Example 2 and 1.24 g (0.005 mol) of 1,3-bis(3-aminopropyl)tetramethyldisiloxane were dissolved in 50 g of NMP. To this, 12.4 g (0.04 mol) of 3,3',4,4'-diphenylethertetracarboxylic anhydride and 21 g of NMP were added, and then reaction carried out for 1 hour at 20° C. and for a further 2 hours at 50° C. Next, there was added 0.98 g (0.01 g) of maleic anhydride and stirring carried out for 2 hours at 50° C., after which there was added dropwise over 10 minutes a solution of 14.7 g (0.1 mol) of N,N-dimethylformamide diethyl acetal diluted with 5 g of NMP. Following the end of the dropwise addition, stirring was carried out for 3 hours at 50° C.

1.6 g of the quinonediazide compound (3) obtained in Synthesis Example 5 was dissolved in 30 g of the polymer solution obtained and photosensitive resin composition varnish C obtained. When the dielectric breakdown strength of cured film of the varnish obtained was measured using a measurement test-piece, it was 430 kV/mm.

Synthesis Example 9

Under a current of dry nitrogen, 43 g (0.17 mol) of diphenylether-4,4'-dicarboxylic acid and 44.7 g (0.33 mol) of 1-hydroxybenzotriazole were reacted in 300 g of N,N-dimethylacetamide. 73.9 g (0.15 mol) of the dicarboxylic acid derivative obtained and 61.1 g (0.17 mol) of hexafluoro-2,2-bis(3-amino-4-hydroxyphenyl)propane were dissolved under a current of dry nitrogen in 500 g of NMP. Thereafter, stirring was carried out for 10 hours at 80° C.

2 g of quinonediazide compound (2) obtained in Synthesis Example 4 was dissolved in 40 g of the polymer solution thus obtained, and photosensitive resin composition varnish D obtained. When the dielectric breakdown strength of cured film of the varnish was measured using a measurement test-piece, it was 400 kV/mm.

Synthesis Example 10

Under a current of dry nitrogen, 24.8 g of 3,3',4,4'-diphenylethertetracarboxylic dianhydride and 59.3 g of n-butyl alcohol were introduced into a 500 ml four-necked flask, and reaction carried out for 5 hours at 95° C. The excess n-butyl alcohol was driven off under reduced pressure, and the di-n-butyl 3,3',4,4'-diphenylethertetracarboxylic acid ester obtained. Next, under a current of dry nitrogen, 95.2 g of thionyl chloride and 70.0 g of toluene were introduced into a 300 ml four-necked flask, and reaction carried out for 3 hours at 40° C. The excess thionyl chloride was eliminated as an azeotrope with toluene under reduced pressure. 186 g of NMP was added and a solution of the di-n-butyl 3,3',4,4'-diphenylethertetracarboxylate ester dichloride obtained.

Next, under a current of dry nitrogen, 95.0 g of NMP, 8.5 g of 3,5-diaminobenzoic acid and 4.8 g of 4,4'-diaminodiphenyl ether were introduced into a 500 ml four-necked flask, and dissolved by stirring. Thereafter, 12.7 g of pyridine was added and, while maintaining the temperature at 0–5° C., the solution of di-n-butyl 3,3',4,4'-diphenylethertetracarboxylate ester dichloride was added dropwise over 1 hour, after which stirring was continued for 1 hour. The solution obtained was introduced into 5 liters of water. The precipitate was recovered and washed, then dried under reduced pressure, and the polyamic acid n-butyl ester obtained.

30.0 g of the polyamic acid n-butyl ester, 7.5 g of the compound obtained by reacting 2,3,4,4'-tetrahydroxybenzophenone and naphthoquinone-1,2-diazido-5-sulphonyl chloride at a molar ratio of ⅓, and 2 g of (p-nitrobenzyl)-9,10-diethoxyanthracene-2-sulphonate were dissolved in 45 g of NMP by stirring, and photosensitive resin composition varnish E obtained. When the dielectric breakdown strength of cured film of the varnish obtained was measured using a measurement test-piece, it was 410 kV/mm.

Example 1

A glass substrate comprising alkali-free glass of thickness 1.1 mm, on the surface of which had been formed an ITO transparent electrode film of thickness 130 nm by a sputtering vapour-deposition method, was cut to size 120×100 mm. Patterning was carried out by applying a photoresist onto the ITO substrate and then performing exposure and developing according to the usual photolithography method. After eliminating the unnecessary portions of the ITO by etching, the photoresist was removed and ITO film patterned in the form of stripes of length 90 mm and width 80 $\mu$m was obtained. There were arranged 816 of these stripe-shaped first electrodes at a 100 $\mu$m pitch.

Figure 10:
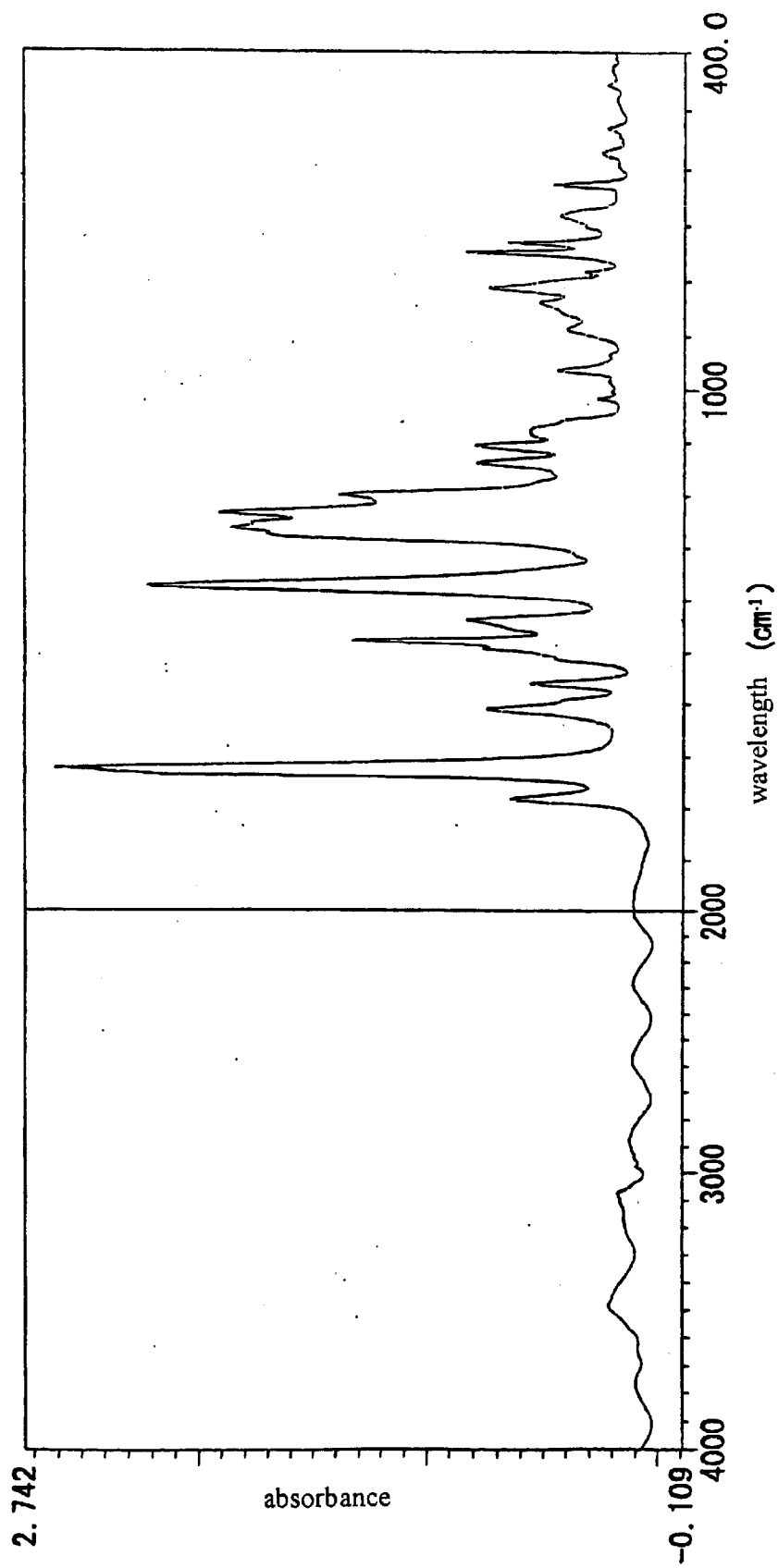
FIG. 10: Infrared absorption spectrum of the insulating layer.

Next, concentration adjustment of a positive-type photosensitive polyimide precursor (PW-1000, produced by Toray Industries Inc.) was carried out, and then this applied by spin coating onto the substrate on which the first electrodes had been formed. Pre-baking was carried out for 2 minutes at 120° C. on a hot plate. After UV exposure of this film through a photomask, developing was carried out by dissolving only the exposed regions with 2.38% TMAH solution, followed by rinsing with pure water. The polyimide precursor pattern obtained was cured by heating for 30 minutes at 170° C. and then for 60 minutes at 320° C. in a clean oven under an atmosphere of nitrogen. In this way there was formed an insulating layer comprising photosensitive polyimide in which there were arranged in the widthwise direction 816 openings of width 70 $\mu$m and length 250 $\mu$m at a 100 $\mu$m pitch, and 200 such openings in the lengthwise direction at a pitch of 300 $\mu$m, with the centre region of a first electrode exposed in each opening as shown in FIG. 1 and the edge regions of the first electrode covered. The thickness of the insulating layer was about 1 $\mu$m, and the volume resistivity was confirmed as being at least 1×10$^{10}$ $\Omega$cm. The cross-section of the boundary portion of the insulating layer had a tapered shape as shown in FIG. 3, and the taper angle θ was about 45°. Furthermore, when the infrared absorption spectrum of the insulating layer was measured using a reflection mode, absorption peaks in the region of 1780 cm$^{-1}$ and 1377 cm$^{-1}$ due to the imide structure of the polyimide were found. The infrared absorption spectrum of cured film was measured using the varnish obtained (FIG. 10).

When the dielectric breakdown strength of the PW-1000 was measured using a measurement test-piece, it was 420 kV/mm.

Next, the construction of an organic electroluminescent device was carried out using the substrate on which the insulating film had been formed. The thin film layer containing the light-emitting layer was formed by the vacuum vapour deposition method based on a resistance wire heating system. The degree of vacuum at the time of the vapour deposition was 2×10$^{-4}$ Pa or below. During the vapour deposition, the substrate was rotated in terms of the vapour deposition source. Firstly, 15 nm of copper phthalocyanine and 60 nm of bis(N-ethylcarbazole) were vapour-deposited over the entire effective substrate area, and a positive hole transport layer formed.

Figure 8:
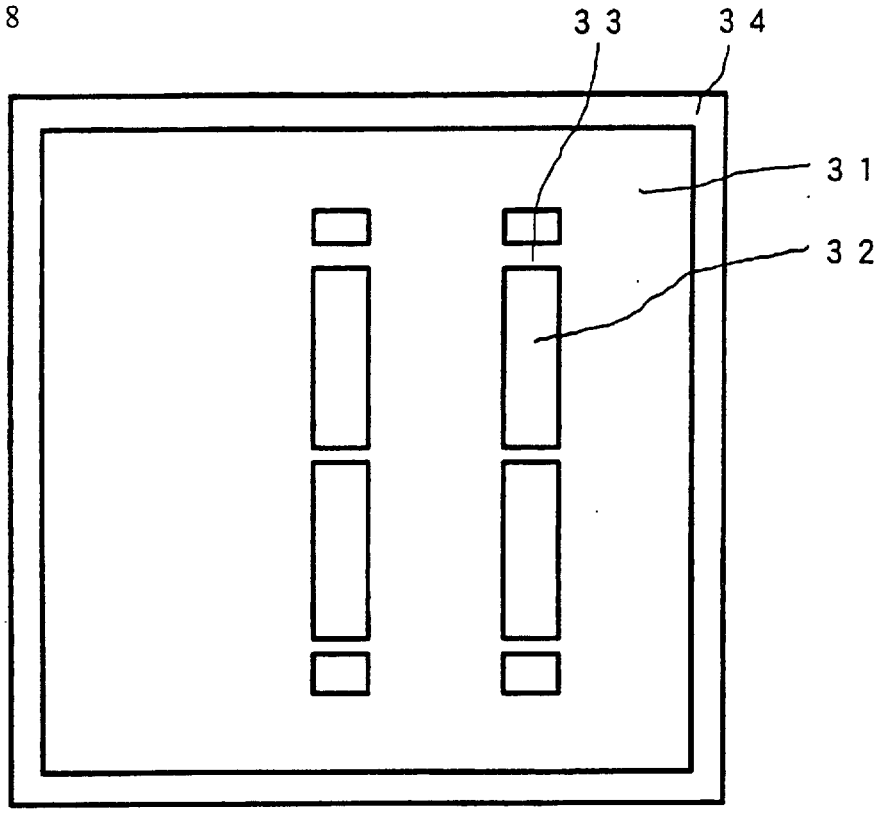
FIG. 8: A plan view showing schematically the shadow mask for light-emitting layer patterning.

For the light-emitting layer patterning, there was used a shadow mask with mask regions and reinforcing wires formed within the same plane as shown schematically in FIG. 8. The outer shape of the shadow mask was 120×84 mm, and the thickness of mask region 31 was 25 $\mu$m. 272 stripe-shaped openings of length 64 mm and width 100 $\mu$m were arranged at a 300 $\mu$m pitch. In each stripe-shaped opening 32, reinforcing wires 33 of width 20 $\mu$m and thickness 25 $\mu$m were formed at a 1.8 mm spacing, perpendicular to the opening. The shadow mask was fixed to a stainless steel plate 34 of width 4 mm, of identical outer shape.

The shadow mask for the light-emitting layer was arranged to the front of the substrate and the two then affixed together, while a ferrite plate magnet (YBM-1B, made by Hitachi Metals Ltd) was arranged to the substrate rear. At this time, the stripe-shaped first electrodes were positioned in the centre of the stripe-shaped openings of the shadow mask, the reinforcing wires were positioned on the insulating layer and, furthermore, it was arranged that the reinforcing wires and the insulating layer were in contact. Since the shadow mask was in contact with the insulating layer, which was of high film thickness, and did not contact the previously-formed organic layer, mask damage was prevented. In this state, by vapour deposition of 21 nm of 8-hydroxyquinoline-aluminium complex (Alq3) doped with 0.3 wt % 1,3,5,7,8-pentamethyl-4,4-difluoro-4-bora-3a,4a-diaza-s-indacene (PM546), patterning of the green light-emitting layer was effected.

Next, with the shadow mask positioned on the first electrode pattern at a position staggered by 1 pitch, patterning of the red light-emitting layer was effected by the vapour deposition of 15 nm of Alq3 doped with 1 wt % 4-(dicyanomethylene)-2-methyl-6-(julolidylstearyl)pyran (DCJT).

Again, with the shadow mask positioned on the first electrode pattern at a position staggered by 1 pitch, patterning of the blue light-emitting layer was effected by the vapour deposition of 20 nm of 4,4'-bis(2,2'-diphenylvinyl) biphenyl (DPVBi). The respective green, red and blue light-emitting layers were arranged at every three stripe-shaped first electrodes and the exposed regions of the first electrodes were completely covered.

Next, 35 nm of DPVBi and 10 nm of Alq3 were vapour-deposited over the entire effective area of the substrate. Thereafter, by exposure of the thin film layer to lithium vapour, doping was effected (amount by film thickness conversion=0.5 nm).

Figure 9:
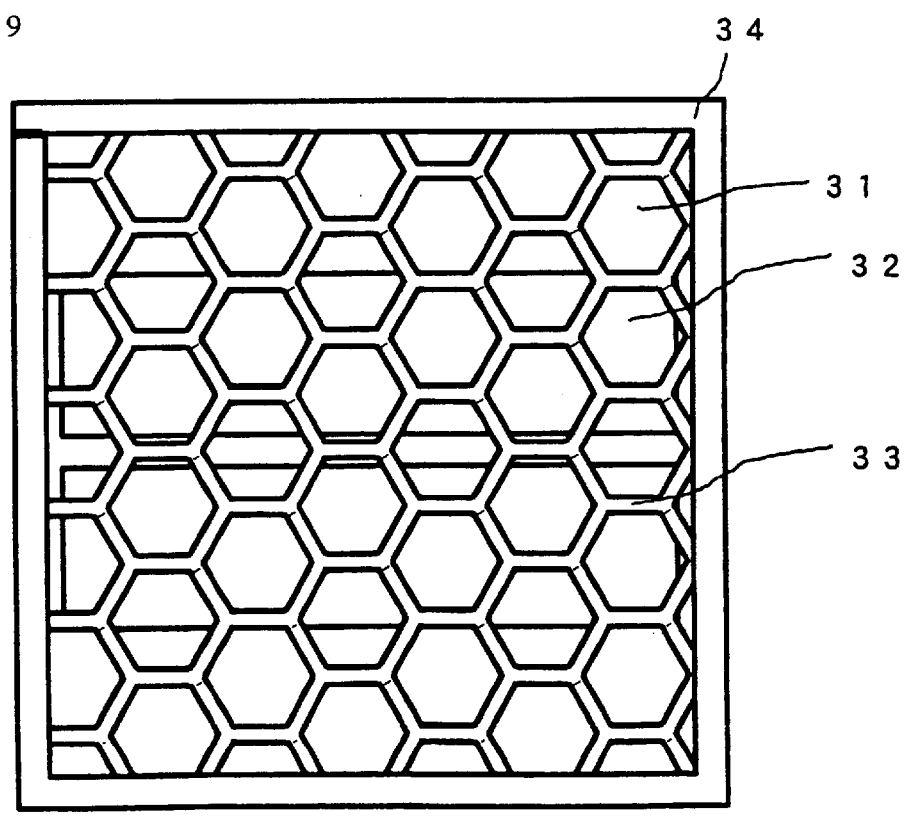
FIG. 9: A plan view showing schematically the shadow mask for second electrode patterning.

For the second electrode patterning, there was employed a shadow mask of structure as shown schematically in FIG. 9 where a gap was present between one face of the mask region and the reinforcing wires. The external shape of the shadow mask was 120×84 mm, and the thickness in mask region 31 was 100 $\mu$m. 200 stripe-shaped openings 32 of length 100 mm and width 250 $\mu$m were arranged at a 300 $\mu$m pitch. Over the mask region there was formed a reinforcing wire mesh 33 of width 40 $\mu$m and thickness 35 $\mu$m having a regular hexagonal structure in which the spacing between two facing sides was 200 $\mu$m. The height of the gap was equal to the thickness of the mask region and was 100 $\mu$m. The shadow mask was fixed to a stainless steel frame 34 of width 4 mm having an identical external shape.

The second electrodes were formed by the vacuum vapour-deposition method based on a resistance wire heating system. The vacuum at the time of the vapour deposition was 3×10$^{-4}$ Pa or below, and during the vapour deposition the substrate was rotated in terms of the two vapour deposition sources. In the same way as the patterning of the light-emitting layers, the shadow mask for the second electrodes was positioned to the front of the substrate and the two affixed together, while a magnet was arranged towards the rear. At this time, the two were positioned so that the insulating layer matched the position of the mask portions. Patterning of the second electrodes was carried out by the vapour-deposition of aluminium at a thickness of 240 nm in this state. The patterning of the second electrodes was carried out in the form of stripes positioned with gaps between and positioned perpendicular to the plurality of stripe-shaped first electrodes arranged with gaps in-between.

The substrate was then removed from the evaporator and held for 20 minutes under a reduced pressure atmosphere by means of a rotary pump, after which it was transferred to an argon atmosphere of dew point no more than −90° C. Under this low moisture atmosphere, sealing was carried out by sticking together the substrate and the glass plate for encapsulation, using a curable epoxy resin.

In this way, a simple matrix type colour organic electroluminescent device was constructed with patterned green, red and blue light-emitting layers formed on 816 ITO stripe-shaped first electrodes of width 80 $\mu$m and pitch 100 $\mu$m, and with 200 stripe-shaped second electrodes of width 250 $\mu$m and pitch 300 $\mu$m arranged at right angles to the first electrodes. Since three light-emitting regions, i.e. red, green and blue light-emitting regions, formed 1 picture element, this luminescent device had 272×200 picture elements at a pitch of 300 $\mu$m. Since there was light emission only in the region where the first electrode was exposed by the insulating layer, one light-emitting region was of a rectangular shape of width 70 $\mu$m and length 250 $\mu$m.

When this display device was subjected to line-sequential driving, it was possible to obtain excellent display characteristics. Since the edge regions of the first electrodes were covered by insulating layer, no shorting due to electric charge concentration was noted. Furthermore, since the cross-section had a tapered shape, at the insulating layer boundary portion the thin film layer and the second electrode were not thinned and no separation was brought about, and there was smooth film formation, so no luminescent degradation within the light-emitting regions was apparent, and stable luminescence was obtained. When, as a test of durability, the emission characteristics were evaluated after leaving for 250 hours at 85° C., it was found that, when compared to initially, the light-emitting regions did not become smaller and excellent luminescence was shown.

When the display device was dismantled to expose the insulating layer, and the dielectric breakdown strength measured using a needle electrode, it was 400 kV/mm.

Example 2

Example 1 was carried out in the same way up to the formation of the insulating layer comprising the positive-type photosensitive polyimide. Next, a negative-type photosensitive polyimide precursor (UR-3100, produced by Toray Industries Inc.) was spin coated on top of the substrate on which the first electrodes and insulating layer had been formed, and then baking carried out for 1 hour at 80° C. in a clean oven under an atmosphere of nitrogen. After UV exposure of this film through a photomask, developing was carried out by dissolving just the unexposed regions with developer liquid (DV-505, produced by Toray Industries Inc.), and then rinsing was performed with pure water. Subsequently, curing was carried out by heating for 30 minutes at 180° C. and then for 30 minutes at 220° C. under a nitrogen atmosphere in a clean oven. Partitions were formed at right angles to the first electrodes. These electrically insulating partitions were positioned on the insulating layer, and were of length 104 mm, width 30 $\mu$m and height 4 $\mu$m. 201 were arranged at a pitch of 300 $\mu$m.

The formation of the thin film layer was carried out in the same way as in Example 1. In the formation of the second electrodes, a separator method was used. That is to say, angled evaporation was carried out in a state with the substrate inclined towards the vapour deposition source, and the vapour deposition of 240 nm of aluminium carried out. In the regions shielded from the evaporated material by being in the shadow of the partitions, there was no deposition of evaporated material, so as a result stripe-shaped second layer patterning was effected. Sealing was then carried out in the same way as in Example 1.

In this way, a simple matrix type colour organic electroluminescent device was constructed with patterned green, red and blue light-emitting layers formed on 816 ITO stripe-shaped first electrodes of width 80 $\mu$m and pitch 100 $\mu$m, and 200 stripe-shaped second electrodes of width 270 $\mu$m and pitch 300 $\mu$m arranged at right angles to the first electrodes. In the same way as in Example 1, this luminescent device had 272×200 picture elements at a pitch of 300 $\mu$m and a single light-emitting region was of rectangular shape of width 70 $\mu$m and length 250 $\mu$m.

When this display device was subjected to line-sequential driving, it was possible to obtain excellent display characteristics in the same way as in Example 1. Since the edge regions of the first electrodes were covered by insulating layer, no shorting due to electric charge concentration was noted. Furthermore, since the cross-section had a tapered shape, at the insulating layer boundary portion there was no thinning and separation of the thin film layer and second electrode, and there was smooth film formation, so no luminescent degradation within the light-emitting regions was apparent and stable luminescence was obtained.

When the display device was dismantled to expose the insulating layer, and the dielectric breakdown strength measured using a needle electrode, it was 400 kV/mm.

Example 3

The same procedure was carried out as in Example 1 up to the first electrode patterning. Next, an insulating layer comprising photosensitive polyimide identical to that in Example 1 was formed except that by adjustment of the concentration of the positive-type photosensitive polyimide precursor (PW-1000, produced by Toray Industries Inc.) and then patterning in the same way as in Example 1, the thickness was about 3 $\mu$m.

Thereafter, a simple matrix type colour organic electroluminescent device was constructed in the same way as in Example 1. When this display device was subjected to line-sequential driving, it was possible to obtain excellent display characteristics in the same way as in Example 1. Since the edge regions of the first electrodes were covered by insulating layer, no shorting due to electric charge concentration was noted. Furthermore, since the cross-section had a tapered shape, in spite of the thickness of the insulating layer being greater than in Example 1, at the insulating layer boundary portion there was no thinning and separation of the thin film layer and second electrode, and there was smooth film formation, so no luminescent degradation within the light-emitting regions was apparent and stable luminescence was obtained. Furthermore, since the insulating layer was thicker, there was even less susceptibility to the effects of mask flaws in the mask vapour-deposition when compared to Example 1, and practically no light-emitting regions of unstable luminescence due to mask flaws were noted.

When the display device was dismantled to expose the insulating layer, and the dielectric breakdown strength measured using a needle electrode, it was 400 kV/mm.

Examples 4 to 8

Example 1 was repeated except that instead of using the positive-type photosensitive polyimide precursor (PW-1000, produced by Toray Industries Inc.), there was used varnish A (Example 4), varnish B (Example 5), varnish C (Example 6), varnish D (Example 7) or varnish E (Example 8).

Whichever varnish was used, when the display device was subjected to line-sequential driving, it was possible to obtain excellent display characteristics. Since the edge regions of the first electrodes were covered by insulating layer, no shorting due to electric charge concentration was noted. Furthermore, since the cross-section had a tapered shape, at the insulating layer boundary portion there was no thinning and separation of the thin film layer and second electrode, and there was smooth film formation, so no luminescent degradation within the light-emitting regions was apparent and stable luminescence was obtained. Again, when as a test of durability, the emission characteristics were evaluated after leaving for 250 hours at 85° C., it was found that, compared to initially, the light-emitting regions had not become smaller and excellent luminescence was shown.

When the display devices were dismantled to expose the insulating layer, and the dielectric breakdown strength measured using a needle electrode, the results were as shown in Table 1.

Examples 9 to 13

Simple matrix type colour organic electroluminescent devices were constructed in the same way as in Example 3, except that instead of the positive-type photosensitive polyimide precursor (PW-1000, produced by Toray Industries Inc.), there was used varnish A (Example 9), varnish B (Example 10), varnish C (Example 11), varnish D (Example 12) or varnish E (Example 13). When the display devices were subjected to line-sequential driving, it was possible to obtain excellent display characteristics in the same way as in Example 1. Since the edge regions of the first electrodes were covered by insulating layer, no shorting due to electric charge concentration was noted. Furthermore, since in each case the cross-section had a tapered shape, in spite of the thickness of the insulating layer being greater than in Example 1, at the insulating layer boundary portion there was no thinning and separation of the thin film layer and second electrode, and there was smooth film formation, so no luminescent degradation within the light-emitting regions was apparent and stable luminescence was obtained. Furthermore, since the insulating layer was thicker, there was even less susceptibility to the effects of mask flaws in the mask evaporation when compared to Example 1, and practically no light-emitting regions of unstable luminescence due to mask flaws were noted.

Comparative Example 1

Using a negative-type photosensitive polyimide precursor (UR-3100, produced by Toray Industries Inc.), an insulating layer comprising negative type photosensitive polyimide was formed in the same way as in the formation of the partitions in Example 2. The thickness of the insulating layer was about 3 $\mu$m as in Example 3, and the insulating layer could be obtained in the same way as in Example 3 except that the angle θ of taper of the cross-section in the boundary portion was about 90° C.

Thereafter, a simple matrix type colour organic electroluminescent device was constructed in the same way as in Example 1. When the display device was subjected to line-sequential driving, no shorting due to electric charge concentration was noted since the edge regions of the first electrodes were covered by insulating layer, but since the cross-section of the insulating layer was practically rectangular, at the boundary portion of the insulating layer the thin film region and second electrode tended to become thinned and luminescent degradation within the light-emitting regions was noted.

When the display device was dismantled to expose the insulating layer, and the dielectric breakdown strength measured using a needle electrode, it was 400 kV/mm.

Comparative Example 2

Pattern processing of the insulating layer was carried out in the same way as in Example 1 except that instead of varnish A there was used a polyimide type positive photoresist (of type having o-nitrobenzyl groups) and there was employed 2% potassium hydroxide solution as the developer. However, the pattern processability was poor and the desired insulating layer pattern was not obtained.

Thereafter, a simple matrix type colour organic electroluminescent device was constructed in the same way as in Example 1. When the display device was subjected to line-sequential driving, since the insulating layer pattern was poor, at the boundary portion of the insulating layer the thin film layer and second electrode became thinner and separation occurred. Shorting due to electric charge concentration, shape faults in the light-emitting regions and luminescent degradation within the light-emitting regions were noted.

When the display device was dismantled to expose the insulating layer, and the dielectric breakdown strength measured using a needle electrode, it was 380 kV/mm.

Comparative Example 3

Pattern processing of the insulating layer was carried out in the same way as in Example 1, except that instead of varnish A there was used a positive type novolak resist OFPR-800 (produced by the Tokyo Ohka Kogyo Co.). This was applied by the spin coating method onto the substrate on which the first electrodes had been formed, and prebaking carried out for 2 minutes at 80° C. on a hot plate, followed by exposure, development and rinsing, after which curing was carried out for 8 minutes at 180° C. The cross-section in the insulating layer boundary portion had a tapered shape as shown in FIG. 3 and the angle of taper was about 45°.

Thereafter, a simple matrix type colour organic electroluminescent device was constructed in the same way as in Example 1. When the display device was subjected to line-sequential driving, initially good light emission was shown but when, as a test of durability, the light-emitting characteristics were evaluated after maintaining for 250 hours at 85° C., the light-emitting regions were reduced to about 80% compared to initially.

When the display device was dismantled to expose the insulating layer, and the dielectric breakdown strength measured using a needle electrode, it was 280 kV/mm.

TABLE 1

|  | Varnish | | Insulating Layer | | | Durability | |
|---|---|---|---|---|---|---|---|
|  | name | type | dielectric breakdown strength | angle of taper | thickness | initial emission characteristics | after 250 hours at 85° C. |
| Ex. 1 | PW-1000 | positive "Photoneece" | 400 V/mm | about 45° | 1 μm | good | good |
| Ex. 2 | PW-1000 | positive "Photoneece" | 400 V/mm | about 45° | 1 μm | good | good |
| Ex. 3 | PW-1000 | positive "Photoneece" | 400 V/mm | about 45° | 3 μm | good | good |
| Ex. 4 | varnish A | employs OH-group-containing acid anhydride | 380 V/mm | about 45° | 1 μm | good | good |
| Ex. 5 | varnish B | employs OH-group-containing acid anhydride and OH-group-containing diamine | 390 V/mm | about 45° | 1 μm | good | good |
| Ex. 6 | varnish C | employs OH-group-containing diamine | 410 V/mm | about 45° | 1 μm | good | good |
| Ex. 7 | varnish D | employs OH-group-containing diamine | 380 V/mm | about 45° | 1 μm | good | good |
| Ex. 8 | varnish E | employs diamine with carboxylic acid groups | 390 V/mm | about 45° | 1 μm | good | good |
| Ex. 9 | varnish A | employs OH-group-containing acid anhydride | 380 V/mm | about 45° | 3 μm | good | good |
| Ex. 10 | varnish B | employs OH-group-containing acid anhydride and OH-group-containing diamine | 390 V/mm | about 45° | 3 μm | good | good |
| Ex. 11 | varnish C | employs OH-group-containing diamine | 410 V/mm | about 45° | 3 μm | good | good |
| Ex. 12 | varnish D | employs OH-group-containing diamine | 380 V/mm | about 45° | 3 μm | good | good |
| Ex. 13 | varnish E | employs diamine with carboxylic acid groups | 390 V/mm | about 45° | 3 μm | good | good |
| Comp. 1 | UR-3100 | negative type photo-sensitive polyimide | 400 V/mm | about 90° | 3 μm | luminescent degradation | — |
| Comp. 2 | photoresist containing o-nitrobenzyl groups | positive type photosensitive polyimide in which o-nitrobenzyl groups are introduced | 380 V/mm | 0° | formation not possible | — | — |
| Comp. 3 | OFPR-800 | novolak type positive resist | 280 V/mm | about 45° | 1 μm | good | emission regions reduced 80% |

Industrial Utilization Potential

The display device of the present invention, which is characterized in that its insulating layer comprises a positive type photosensitive polyimide, does not require the use of a photoresist as in the prior-art, and patterning of the polyimide insulating layer can be carried out simply and in fewer stages. Furthermore, since it is readily possible to make the cross-sectional shape of the insulating layer boundary portion tapered, there is for example smooth formation of the thin film layer which is formed on top and there is no impairment of the stability of the display device characteristics.

What is claimed is:

1. A display device comprising a first electrode formed on a substrate, an insulating layer formed on the first electrode in such a way that the first electrode is partially exposed, and a second electrode facing the first electrode, wherein the insulating layer is a positive-type photosensitive polyimide comprising a polymer having structural units represented by the following general formula and a photoacid generator

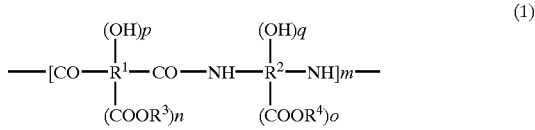

wherein $R^1$ and $R^2$ represent divalent to octavalent organic groups having at least two carbon atoms, and $R^3$ and $R^4$ represent hydrogen, an alkali metal ion, an ammonium ion or an organic group with from 1 to 20 carbons, $R^3$ and $R^4$ may be the same or different, m is an integer in the range 3 to 100,000, and n and o are integers in the range of 0 to 2, p and q are integers in the range of 0 to 4, and n+q>0.

2. A display device according to claim 1 wherein the photoacid generator is an o-quinonediazide compound.

3. A display device according to claim 1 wherein the insulating layer is formed so as to cover the edge regions of the first electrode.

4. A display device according to claim 1 wherein the cross-section of the insulating layer at the boundary portion where the first electrode is partially exposed has a tapered shape.

5. A display device according to claim 1 wherein the display device is a display device having an organic electroluminescent element containing an organic light-emitting layer between the first electrode and the second electrode.

6. A display device according to claim 1 wherein the dielectric breakdown strength of the insulating layer is at least 300 kkV/mm.

* * * * *